(12) United States Patent
Moon

(10) Patent No.: US 12,364,101 B2
(45) Date of Patent: Jul. 15, 2025

(54) DISPLAY APPARATUS, METHOD OF MANUFACTURING THE SAME, AND ELECTRONIC DEVICE

(71) Applicant: Samsung Display Co., Ltd., Yongin-si (KR)

(72) Inventor: Changyun Moon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 139 days.

(21) Appl. No.: 17/581,783

(22) Filed: Jan. 21, 2022

(65) Prior Publication Data
US 2022/0149327 A1 May 12, 2022

Related U.S. Application Data

(62) Division of application No. 16/704,810, filed on Dec. 5, 2019, now Pat. No. 11,258,041.

(30) Foreign Application Priority Data

Jan. 4, 2019 (KR) .................. 10-2019-0001276
Oct. 16, 2019 (KR) .................. 10-2019-0128710

(51) Int. Cl.
*H10K 50/84* (2023.01)
*H10K 50/822* (2023.01)
(Continued)

(52) U.S. Cl.
CPC ......... *H10K 59/121* (2023.02); *H10K 50/822* (2023.02); *H10K 50/8426* (2023.02);
(Continued)

(58) Field of Classification Search
CPC ....... H10K 71/00; H01L 33/14; H01L 33/145; H01L 2224/11916; H01L 2224/27916
See application file for complete search history.

(56) References Cited

U.S. PATENT DOCUMENTS 5,698,934 A 12/1997 Jin et al.
9,761,647 B2 * 9/2017 Lee .................. H10K 59/1213
(Continued)

FOREIGN PATENT DOCUMENTS

CN 102456713 A 5/2012
CN 107025875 A 8/2017
(Continued)

OTHER PUBLICATIONS

European Office Action for EP Application No. 20150191.3 dated Dec. 8, 2023, 6 pages.

*Primary Examiner* — Vu A Vu
*Assistant Examiner* — Valerie N Newton
(74) *Attorney, Agent, or Firm* — Womble Bond Dickinson (US) LLP

(57) ABSTRACT

A display apparatus includes: a base substrate having a front surface, a rear surface opposite to the front surface, a module hole extending through the front surface and the rear surface, an active area, a peripheral area adjacent to the active area, and a margin area adjacent to the module hole; a circuit layer on the base substrate, the circuit layer including a driving element including a thin film transistor; a display element layer including: a deposition preventing pattern; and a light emitting element including: a first electrode connected to the thin film transistor; an emission pattern on the first electrode; and a second electrode disposed on the emission pattern. An encapsulation layer is on the display element layer, and encapsulating the light emitting element. The second electrode and the deposition preventing pattern are at a same layer and do not overlap with each other.

3 Claims, 19 Drawing Sheets

(51) Int. Cl.
*H10K 50/842* (2023.01)
*H10K 50/844* (2023.01)
*H10K 59/121* (2023.01)
*H10K 59/122* (2023.01)
*H10K 59/123* (2023.01)
*H10K 59/40* (2023.01)
*H10K 59/80* (2023.01)
*H10K 71/00* (2023.01)
*H10K 77/10* (2023.01)
*G09G 3/3233* (2016.01)
*H10K 59/12* (2023.01)
*H10K 102/00* (2023.01)

(52) U.S. Cl.
CPC ......... *H10K 50/844* (2023.02); *H10K 59/122* (2023.02); *H10K 59/123* (2023.02); *H10K 59/40* (2023.02); *H10K 59/873* (2023.02); *H10K 71/00* (2023.02); *H10K 77/111* (2023.02); *G09G 3/3233* (2013.01); *H10K 59/12* (2023.02); *H10K 59/1201* (2023.02); *H10K 2102/00* (2023.02); *H10K 2102/311* (2023.02)

(56) References Cited

U.S. PATENT DOCUMENTS

| | | |
|---|---|---|
| 10,186,191 B2 | 1/2019 | Kang et al. |
| 10,374,165 B2 * | 8/2019 | Dorok .................... C07F 9/5765 |
| 11,456,437 B2 * | 9/2022 | Kim ..................... H10K 50/844 |
| 11,462,590 B2 | 10/2022 | Fan et al. |
| 11,678,560 B2 * | 6/2023 | Lim ..................... H10K 59/121 257/89 |
| 2012/0295372 A1 | 11/2012 | Schwab |
| 2017/0031323 A1 | 2/2017 | Kim et al. |
| 2017/0148856 A1 | 5/2017 | Choi et al. |
| 2017/0162637 A1 | 6/2017 | Choi et al. |
| 2019/0051859 A1 | 2/2019 | Choi et al. |
| 2021/0175477 A1 * | 6/2021 | Lim ................... H10K 59/8052 |
| 2022/0013594 A1 * | 1/2022 | Wang ................ H10K 59/80522 |
| 2024/0023365 A1 | 1/2024 | Choi et al. |

FOREIGN PATENT DOCUMENTS

| | | |
|---|---|---|
| CN | 107039493 A | 8/2017 |
| EP | 3 176 771 A2 | 6/2017 |
| EP | 3 176 772 A1 | 6/2017 |
| KR | 10-0354921 B1 | 2/2003 |
| KR | 10-2010-0013522 A | 2/2010 |
| KR | 10-2012-0125280 A | 11/2012 |
| KR | 10-2016-0074333 A | 6/2016 |
| KR | 10-2017-0059864 | 5/2017 |
| KR | 10-2017-0066767 | 6/2017 |
| TW | 201230322 A1 | 7/2012 |
| TW | 201839745 A | 11/2018 |

* cited by examiner

DISPLAY APPARATUS, METHOD OF MANUFACTURING THE SAME, AND ELECTRONIC DEVICE

CROSS-REFERENCE TO RELATED APPLICATIONS

This application is a divisional of U.S. patent application Ser. No. 16/704,810, filed Dec. 5, 2019, which claims priority to and the benefit of Korean Patent Application Nos. 10-2019-0001276, filed Jan. 4, 2019, and 10-2019-0128710, filed on Oct. 16, 2019, the entire content of all of which is incorporated herein by reference.

BACKGROUND

One or more example embodiments of the present disclosure herein relate to a display apparatus and a method of manufacturing the same, and more particularly, to a display apparatus including a module hole in an active area and a method of manufacturing the same.

A display apparatus may be activated by an electrical signal. The display apparatus may include various electronic components, such as a display unit for displaying an image and/or an input sensing unit for sensing an external input. The electronic components may be electrically connected to each other through signal lines that are variously arranged.

Techniques for reducing a non-display area of the display apparatus are being studied, and techniques for improving performance of the electronic components of the display apparatus are being studied.

The above information disclosed in this Background section is for enhancement of understanding of the background of the present disclosure, and therefore, it may contain information that does not constitute prior art.

SUMMARY

One or more example embodiments of the present disclosure are directed to a display apparatus capable of inhibiting or preventing performance deterioration of an electronic module disposed in a module hole, a method of manufacturing the same, and an electronic device. One or more example embodiments of the present disclosure are directed to a display apparatus capable of inhibiting or preventing performance deterioration of an electronic module disposed under an area of a display panel, a method of manufacturing the same, and an electronic device.

According to an embodiment of the present disclosure, a display apparatus includes: a base substrate having a front surface, a rear surface opposite to the front surface, a module hole extending through the front surface and the rear surface, an active area, a peripheral area adjacent to the active area, and a margin area adjacent to the module hole; a circuit layer on the base substrate, the circuit layer including a driving element including a thin film transistor; a display element layer including: a deposition preventing pattern; and a light emitting element including: a first electrode connected to the thin film transistor; an emission pattern on the first electrode; and a second electrode on the emission pattern; and an encapsulation layer on the display element layer, the encapsulating layer encapsulating the light emitting element. The second electrode and the deposition preventing pattern are at a same layer and do not overlap with each other.

In an embodiment, the deposition preventing pattern may include ABH113.

In an embodiment, the deposition preventing pattern may overlap with the margin area, and the second electrode may overlap with the active area.

In an embodiment, a thickness of the deposition preventing pattern may be greater than a thickness of the second electrode.

In an embodiment, the second electrode may include magnesium (Mg), silver (Ag), or a combination thereof.

In an embodiment, the deposition preventing pattern may be exposed by the module hole.

In an embodiment, the encapsulation layer may include: an encapsulation substrate; and a sealing member between the encapsulation substrate and the display element layer, the sealing member overlapping with the margin area.

In an embodiment, the sealing member may contact the deposition preventing pattern.

In an embodiment, the light emitting element may further include a control layer between the emission pattern and the second electrode, and the second electrode and the deposition preventing pattern may each contact the control layer.

In an embodiment, the encapsulation layer may include a first inorganic layer, an organic layer, and a second inorganic layer that may be sequentially stacked on the display element layer.

In an embodiment, the base substrate may have a recess pattern that is adjacent to the module hole in a plan view, and the recess pattern may overlap with the margin area.

In an embodiment, the display apparatus may further include: an organic pattern on the recess pattern, and the organic pattern may include ABH113.

According to an embodiment of the present disclosure, a display apparatus includes: a base substrate having a front surface, a rear surface opposite to the front surface, a module hole extending through the front surface and the rear surface, an active area, a peripheral area adjacent to the active area, and a margin area adjacent to the module hole; a circuit layer on the base substrate, the circuit layer including a driving element including a thin film transistor; a display element layer including: a deposition preventing pattern; and a light emitting element including a first electrode connected to the thin film transistor, an emission pattern on the first electrode, and a second electrode on the emission pattern; and an encapsulation layer on the display element layer, the encapsulation layer encapsulating the light emitting element. The deposition preventing pattern overlaps with the margin area and includes ABH113.

In an embodiment, the deposition preventing pattern and the second electrode may be at a same layer.

In an embodiment, the second electrode may include magnesium (Mg), silver (Ag), or a combination thereof.

According to an embodiment of the present disclosure, a method of manufacturing a display apparatus including a base substrate having a front surface, a rear surface opposite the front surface, an active area, a peripheral area adjacent to the active area, and a hole area adjacent to the active area is provided. The method includes: forming a first electrode, an emission pattern, and a control layer on the base substrate; forming a deposition preventing layer on the control layer, the deposition preventing layer overlapping with the hole area; forming a second electrode on the control layer, the second electrode overlapping with the active area and not overlapping with the deposition preventing layer; forming an encapsulation layer on the second electrode; and forming a module hole that penetrates the base substrate, the module hole overlapping with the hole area.

In an embodiment, the forming of the deposition preventing layer may include: depositing and patterning ABH113.

In an embodiment, the forming of the second electrode may include: depositing magnesium (Mg) or silver (Ag) on the control layer.

According to an embodiment of the present disclosure, an electronic device includes: a base layer; a deposition preventing pattern on the base layer and including ABH113; and an electrode pattern at a same layer as that of the deposition preventing pattern and not overlapping with the deposition preventing pattern, the electrode pattern including a metal material.

In an embodiment, the metal material may include magnesium (Mg), silver (Ag), or a combination thereof.

According to an embodiment of the present disclosure, an electronic device includes: an electronic module; and a display panel including: a first display area; and a second display area adjacent to the first display area, the second display area overlapping with the electronic module, and including: a circuit layer including driving elements including thin film transistors; and a display element layer including one or more light emitting elements and a deposition preventing pattern. The light emitting elements include: first electrodes connected to the thin film transistors; emission patterns on the first electrodes; and a second electrode on the emission patterns. The deposition preventing pattern is at a same layer as that of the second electrode, the second electrode overlaps with the first display area and the second display area, and the deposition preventing pattern overlaps with the second display area.

In an embodiment, the deposition preventing pattern may include ABH113.

In an embodiment, a thickness of the deposition preventing pattern may be greater than a thickness of the second electrode.

In an embodiment, the second electrode may include magnesium (Mg), silver (Ag), or a combination thereof.

In an embodiment, a number of the emission patterns per a unit area in the second display area may be less than a number of the emission patterns per a unit area in the first display area.

In an embodiment, the second display area may include: a light emitting zone at which the emission patterns may be located; and a transmission zone at which the deposition preventing pattern may be located.

In an embodiment, the second electrode may overlap with the light emitting zone.

In an embodiment, the second electrode may be on first electrodes from among the first electrodes that overlap with the light emitting zone, and the deposition preventing pattern may be on first electrodes from among the first electrodes that overlap with the transmission zone.

In an embodiment, the first display area and the second display area may be arranged along a first direction, and the second display area may extend in a second direction that crosses the first direction.

In an embodiment, the electronic module may include at least one of a sound output module, a light emitting module, a light receiving module, or a camera module.

BRIEF DESCRIPTION OF THE DRAWINGS

The above and other aspects and features of the present inventive concept will be more clearly understood from the following detailed description of the illustrative, non-limiting example embodiments with reference to the accompanying drawings, in which.

DETAILED DESCRIPTION

Figure 1:
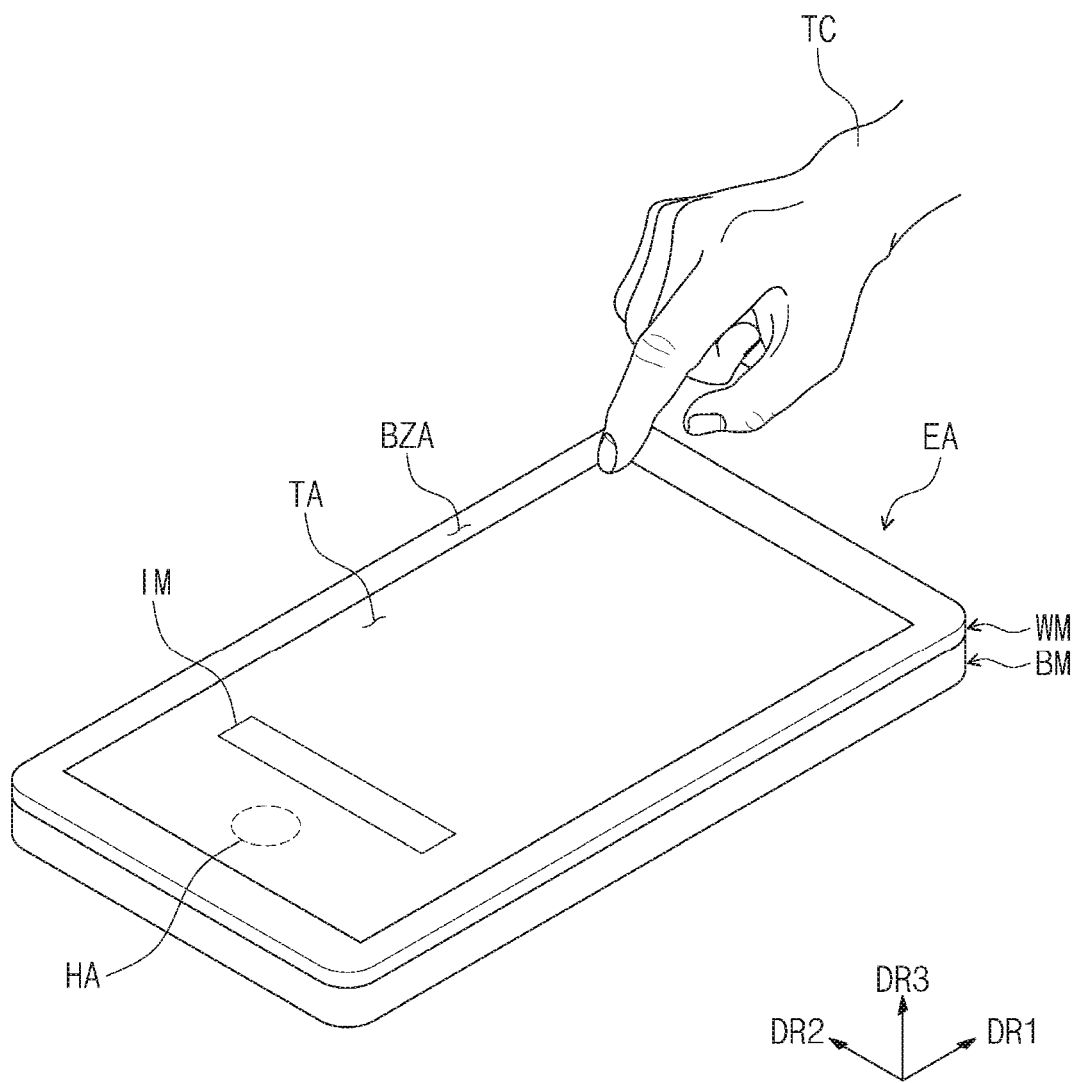
FIG. 1 is a perspective view illustrating a display apparatus according to an embodiment of the inventive concepts.

Hereinafter, example embodiments will be described in more detail with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. For example, terms such as "about" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
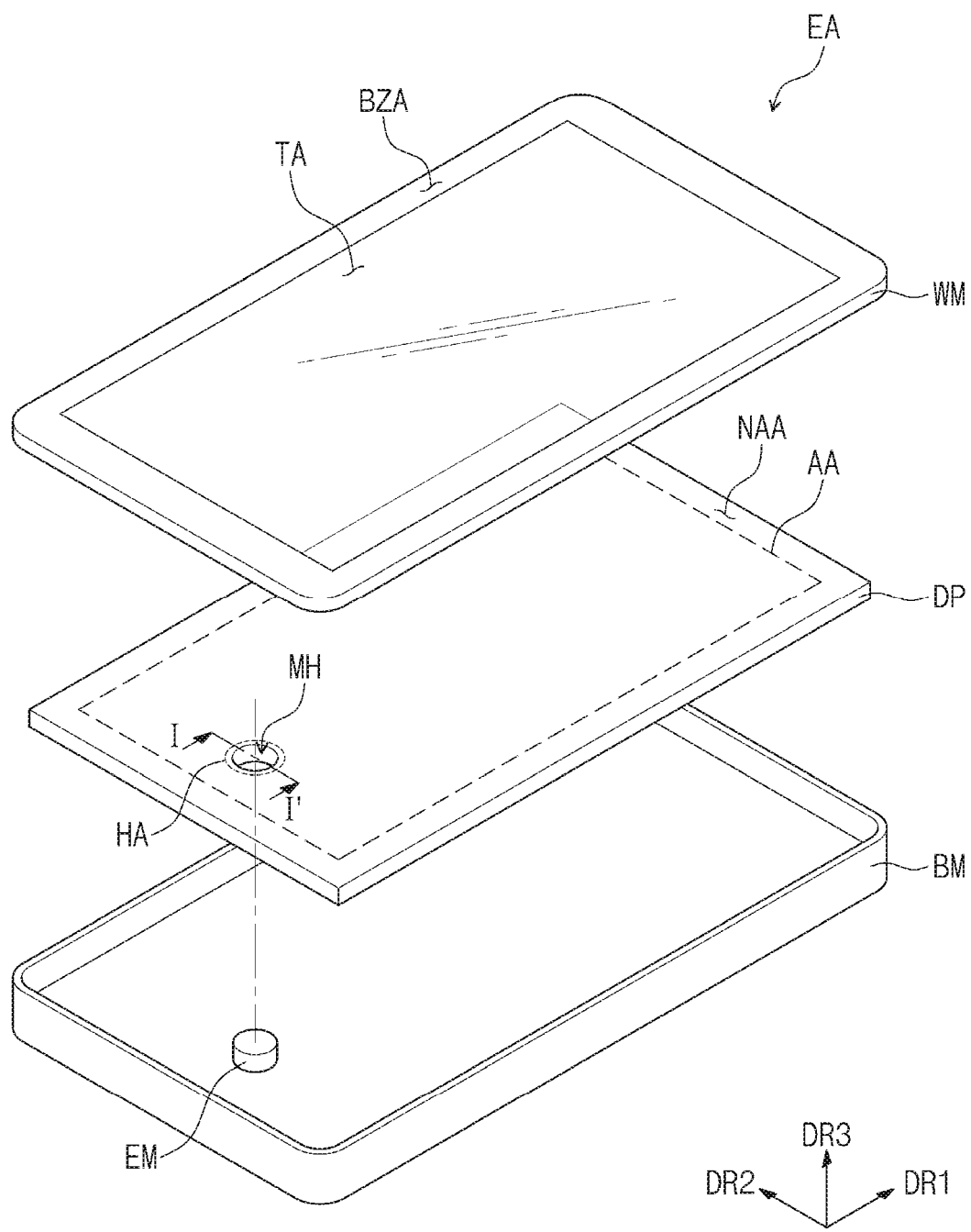
FIG. 2 is an exploded perspective view illustrating the display apparatus of FIG. 1.
Figure 3:
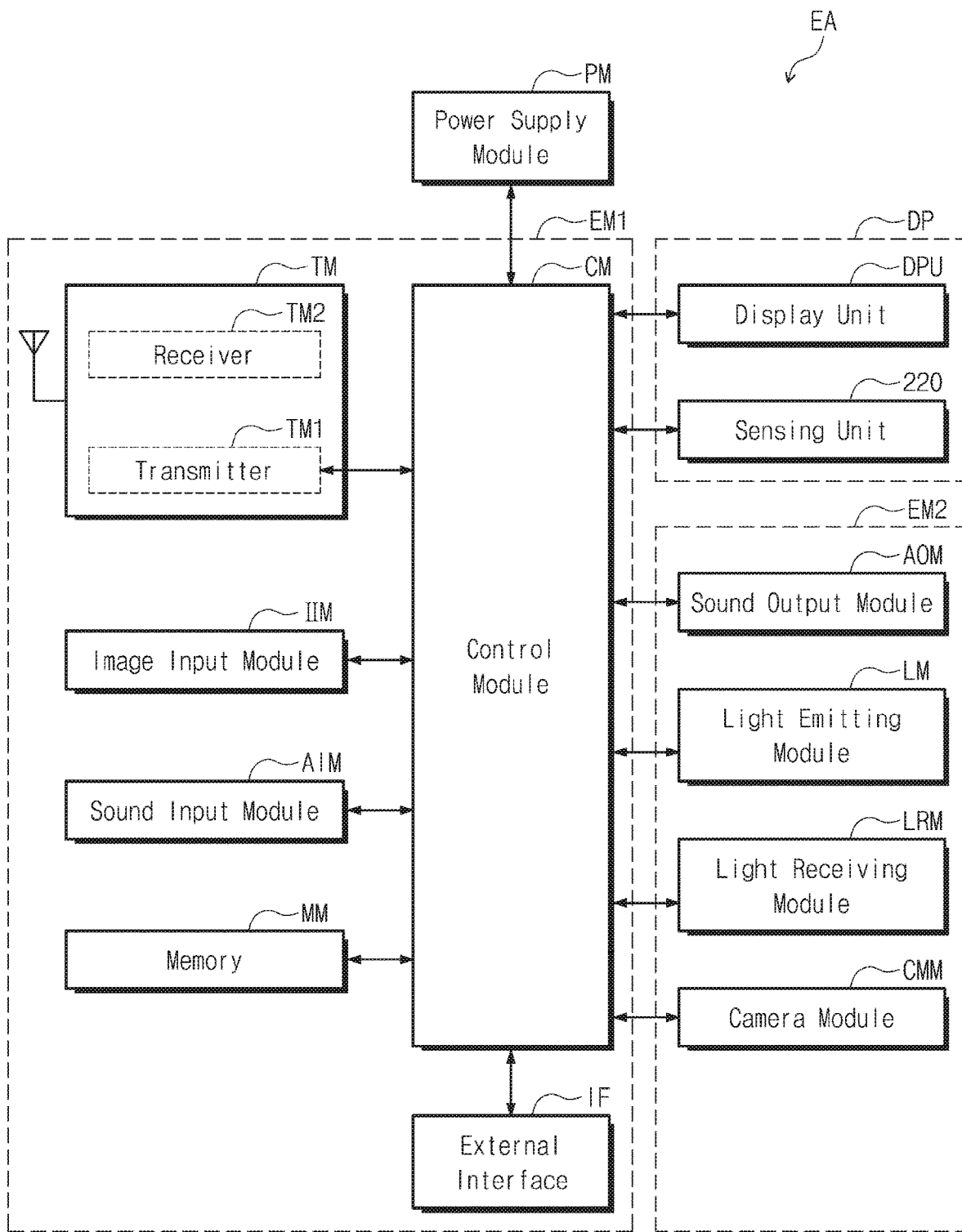
FIG. 3 is a block diagram of the display apparatus illustrated in FIG. 1.

FIG. 1 is a perspective view illustrating a display apparatus according to an embodiment of the inventive concepts. FIG. 2 is an exploded perspective view illustrating the display apparatus of FIG. 1. FIG. 3 is a block diagram of the display apparatus illustrated in FIG. 1. Hereinafter, a display apparatus according to an embodiment of the inventive concepts will be described with reference to FIGS. 1-3.

A display apparatus EA may be activated by an electrical signal. The display apparatus EA may be realized as various embodiments. For example, the display apparatus EA may be realized as a tablet, a notebook computer, a personal computer, a smart television, a smart phone, or any other suitable electronic apparatus. In the present embodiment, a smart phone is illustrated as an example of the display apparatus EA.

As illustrated in FIG. 1, the display apparatus EA may display an image IM at (e.g., on) a front surface of the display apparatus EA. The front surface may be parallel or substantially parallel to a plane defined by a first direction DR1 and a second direction DR2. The front surface may include a transmission area TA and a bezel area BZA adjacent to, partially surrounding, or surrounding (e.g., a periphery of) the transmission area TA.

The display apparatus EA may display the image IM at (e.g., in or on) the transmission area TA. In FIG. 1, an internet search box is illustrated as an example of the image IM, but the inventive concept is not limited thereto. The transmission area TA may have a quadrilateral shape (e.g., a rectangular shape) parallel or substantially parallel to the first and second directions DR1 and DR2. However, embodiments of the inventive concepts are not limited thereto. In other embodiments, the shape of the transmission area TA may be variously modified.

The bezel area BZA may be adjacent to the transmission area TA or may surround (e.g., a periphery of) the transmission area TA when viewed in a plan view (e.g., viewed in a direction normal to the front surface of the display apparatus EA, or on a plane parallel to the front surface of the display apparatus EA). However, embodiments of the inventive concepts are not limited thereto. In other embodiments, for example, the bezel area BZA may be adjacent to only one side of the transmission area TA or may be omitted. In other words, the display apparatus EA according to one or more embodiments of the inventive concepts may be variously embodied and is not limited to a specific embodiment.

A normal direction of the front surface may correspond to a thickness direction DR3 (hereinafter, referred to as a third direction) of the display apparatus EA. In the present embodiment, a front surface (or a top surface) and a rear surface (or a bottom surface) of each member (e.g., component or element) may be defined based on a direction (e.g., the third direction DR3) in which the image IM is displayed. For example, the front surface and the rear surface may be opposite to each other in the third direction DR3.

However, directions indicated by the first to third directions DR1, DR2 and DR3 may be relative concepts (e.g., representative directions), and may be variously modified into other suitable directions. Hereinafter, the first to third directions refer to the representative directions indicated by the first to third directions DR1, DR2 and DR3 illustrated in FIG. 1, respectively.

In some embodiments, the display apparatus EA may sense a user's input TC applied from the outside. For example, the user's input TC may include at least one of various kinds of external inputs, for example, such as a part of a user's body (e.g., a finger), light, heat, and pressure. In the present embodiment, a user's hand applied to the front surface is illustrated as an example of the user's input TC. However, embodiments of the inventive concepts are not limited thereto. In other words, the user's input TC may be provided in various suitable forms, as described above. In some embodiments, the display apparatus EA may also sense the user's input TC applied to a side surface and/or a rear surface of the display apparatus EA, based on a structure of the display apparatus EA.

As illustrated in FIGS. 1 and 2, the display apparatus EA may include a display panel DP, a window member WM, an electronic module (e.g., an electronic component or device) EM, and a receiving member (e.g., a housing or case) BM. As illustrated in FIG. 3, the display apparatus EA may further include a first electronic module (e.g., a first electronic component or device) EM1, a second electronic module (e.g., a second electronic component or device) EM2, and a power supply module (e.g., a power supply) PM, in addition to the display panel DP. Some of the components illustrated in FIG. 3 are not shown in FIG. 2. Hereinafter, the display apparatus EA will be described in more detail with reference to FIGS. 1-3.

The display panel DP may display the image IM and may sense the external input TC. For example, the display panel DP may include a display unit (e.g., a display) DPU for displaying the image IM, and a sensing unit (e.g., a sensor) 220 for sensing the external input TC. In the present embodiment, the sensing unit 220 may sense the external input TC applied to the window member WM.

The display panel DP may include an active area AA, a peripheral area NAA, and a hole area HA, which are defined when viewed in a plan view (e.g., viewed in a direction normal to the front surface of the display apparatus EA or on a plane parallel to the front surface of the display apparatus EA). The active area AA may be an area that is activated by an electrical signal.

In the present embodiment, the active area AA may be an area at (e.g., in or on) which the image IM is displayed, and may also be an area at (e.g., in or on) which the external input TC is sensed. However, embodiments of the inventive concepts are not limited thereto. In another embodiment, an area for displaying the image IM and an area for sensing the external input TC may be separated from each other at (e.g., in or on) the active area AA.

The peripheral area NAA may be covered by the bezel area BZA. The peripheral area NAA may be adjacent to the active area AA. The peripheral area NAA may surround (e.g., around a periphery of) the active area AA when viewed in a plan view (e.g., viewed in a direction normal to the front surface of the display apparatus EA or on a plane parallel to the front surface of the display apparatus EA). A driving circuit and/or driving lines for driving the active area AA may be disposed at (e.g., in or on) the peripheral area NAA.

In the present embodiment, the display panel DP may be assembled in a flat state where the active area AA and the peripheral area NAA face the window member WM. However, embodiments of the inventive concepts are not limited thereto. In another embodiment, a portion of the peripheral area NAA of the display panel DP may be bent (or folded).

In this case, a portion of the peripheral area NAA may face a rear surface of the display apparatus EA, and thus, the bezel area BZA at (e.g., in or on) the front surface of the display apparatus EA may be reduced. In still another embodiment, the display panel DP may be assembled in a state where a portion of the active area AA is also bent (or folded). In yet another embodiment, the peripheral area NAA may be omitted in the display panel DP.

An edge of the hole area HA may be surrounded (or partially surrounded) by the active area AA when viewed in a plan view (e.g., viewed in a direction normal to the front surface of the display apparatus EA or on a plane parallel to the front surface of the display apparatus EA). The hole area HA may be spaced apart from the peripheral area NAA with the active area AA interposed therebetween when viewed in a plan view (e.g., viewed in a direction normal to the front surface of the display apparatus EA or on a plane parallel to the front surface of the display apparatus EA).

The hole area HA may be an area in which a module hole MH is defined. Thus, the module hole MH may be surrounded (e.g., around its periphery) by the active area AA in which the image IM is displayed when viewed in a plan view (e.g., viewed in a direction normal to the front surface of the display apparatus EA or on a plane parallel to the front surface of the display apparatus EA).

The module hole MH may penetrate (e.g., extend through) the display panel DP along the third direction DR3. In some embodiments, at least one or more module holes MH may penetrate (e.g., extend through) the display panel DP. The module hole MH may be a through-hole which penetrates (e.g., extends through) the display panel DP from a front surface of the display panel DP to a rear surface of the display panel DP. A component that is disposed on the rear surface of the display panel DP and that overlaps with the module hole MH may be visible through the module hole MH from the front of the display panel DP. In the present embodiment, the module hole MH is illustrated in a cylindrical shape having a height in the third direction DR3. However, embodiments of the inventive concepts are not limited thereto. In some embodiments, the module hole MH may have one of other various suitable shapes, for example, such as a polygonal cylinder shape, an elliptic cylinder shape, a truncated shape, or any other suitable shape.

The module hole MH may overlap with the electronic module EM when viewed in a plan view. The electronic module EM may receive an external input through the module hole MH. The electronic module EM may receive a signal inputted through the module hole MH, and may provide the received signal to the display panel DP. The electronic module EM may be received in the module hole MH or may include a receiving part having a similar or substantially the same size as at least a size of the module hole MH. The electronic module EM will be described in more detail below.

The window member WM may define (e.g., provide) the front surface of the display apparatus EA. The window member WM may be disposed on the front surface of the display panel DP to protect the display panel DP. For example, the window member WM may include a glass substrate, a sapphire substrate, a plastic film, or a substrate or film made of any other suitable material. The window member WM may have a single-layer structure or a multi-layered structure. For example, the window member WM may have a stack structure including a plurality of plastic films coupled to each other by an adhesive, or may have a stack structure including a glass substrate and a plastic film coupled to each other by an adhesive.

The window member WM may include the transmission area TA and the bezel area BZA. The transmission area TA may transmit light incident thereto. The transmission area TA may have a shape corresponding to a shape of the active area AA. For example, the transmission area TA may overlap with the entirety (e.g., whole of) or at least a portion of the active area AA. The image IM displayed at (e.g., in or on) the active area AA of the display panel DP may be visible to the outside through the transmission area TA.

A light transmittance of the bezel area BZA may be less than a light transmittance of the transmission area TA. The bezel area BZA may define the shape of the transmission area TA. The bezel area BZA may be adjacent to the transmission area TA and may surround (e.g., a periphery of) the transmission area TA in a plan view.

The bezel area BZA may have a color (e.g., a predetermined color). The bezel area BZA may cover the peripheral area NAA of the display panel DP to prevent or substantially prevent the peripheral area NAA from being visible to the outside. However, embodiments of the inventive concepts are not limited thereto. In another embodiment of the inventive concepts, the bezel area BZA may be omitted from the window member WM.

The receiving member BM may be coupled to the window member WM. The receiving member BM may define (e.g., provide) a rear surface of the display apparatus EA. The receiving member BM may be coupled to the window member WM to define an inner space.

The receiving member BM may be formed of a material having relatively high rigidity. For example, the receiving member BM may include a plurality of frames and/or plates, which may be formed of glass, plastic, metal, and/or any other suitable material or combination of materials. The receiving member BM may stably protect or substantially protect the components of the display apparatus EA received in the inner space from an external impact. The display panel DP and the various components illustrated in FIG. 3 may be received in the inner space provided by the receiving member BM.

Referring to FIG. 3, the display apparatus EA may include a power supply module (e.g., a power supply) PM, a first electronic module (e.g., a first electronic component or device) EM1, and a second electronic module (e.g., a second electronic component or device) EM2. The power supply module PM may supply power used for operations (e.g., overall operations) of the display apparatus EA. The power supply module PM may include a battery module.

The first electronic module EM1 and the second electronic module EM2 may include various functional modules for operating the display apparatus EA. The first electronic module EM1 may be mounted on (e.g., directly on) a motherboard that is electrically connected to the display panel DP. Alternatively, the first electronic module EM1 may be mounted on an additional board so as to be electrically connected to the motherboard through a connector.

The first electronic module EM1 may include a control module (e.g., a controller) CM, a wireless communication module (e.g., a wireless communication device or transceiver) TM, an image input module (e.g., an image input device) IIM, a sound input module (e.g., a sound input device) AIM, a memory (e.g., a memory device or storage device) MM, and an external interface IF. In an embodiment, some of the components (e.g., the modules) may not be mounted on the motherboard and may be electrically connected to the motherboard through a circuit board (e.g., a flexible circuit board), for example.

The control module CM may control operations (e.g., overall operations) of the display apparatus EA. The control module CM may include a microprocessor. For example, the control module CM may activate or deactivate the display panel DP. The control module CM may control other module(s) (e.g., the image input module IIM, the sound input module AIM, and/or the like) based on a touch signal received from the display panel DP.

The wireless communication module TM may transmit/receive a wireless signal to/from other terminal(s) or devices by using, for example, Bluetooth, Wi-Fi, near field communication (NFC), LTE, and/or any other suitable kinds of wireless communications known to those skilled in the art. The wireless communication module TM may transmit/receive a voice signal by using a general communication line. The wireless communication module TM may include a transmitter TM1, which is configured to modulate a signal to be transmitted and to transmit the modulated signal, and a receiver TM2, which is configured to demodulate a received signal.

The image input module IIM may process image signals to convert the image signals into image data usable by the display panel DP. The sound input module AIM may receive an external sound signal through, for example, a microphone in a recording mode or a voice recognition mode, and may convert the received sound signal into electrical sound data.

The external interface IF may be connected to, and interface with, an external charger, a cable/wireless data port, a card socket (e.g., a memory card or a SIM/UIM card), and/or the like.

The second electronic module EM2 may include a sound output module (e.g., a sound output device or speaker) AOM, a light emitting module (e.g., a light emitting device) LM, a light receiving module (e.g., a light sensor) LRM, and a camera module (e.g., a camera) CMM. The components of the second electronic module EM2 may be mounted on (e.g., directly on) the motherboard, or may be mounted on an additional board that is electrically connected to the display panel DP and/or to the first electronic module EM1 through a connector.

The sound output module AOM may convert sound data received from the wireless communication module TM and/or sound data stored in the memory MM and may output the converted sound data to the outside.

The light emitting module LM may generate light, and may output the generated light. The light emitting module LM may output infrared light. The light emitting module LM may include a light emitting diode (LED) element. The light receiving module LRM may sense infrared light. The light receiving module LRM may be activated when sensing the infrared light having a suitable level (e.g., a predetermined level). The light receiving module LRM may include a CMOS sensor. After the infrared light generated in the light emitting module LM is outputted, the infrared light may be reflected by an external object (e.g., a finger or a face of a user), and the reflected infrared light may be incident to the light receiving module LRM. The camera module CMM may acquire an external image.

The electronic module EM illustrated in FIG. 2 may receive an external input provided through the module hole MH and/or may provide an output signal through the module hole MH. The electronic module EM may include at least one of the components (e.g., the modules) of the first and second electronic modules EM1 and EM2. For example, the electronic module EM may include a camera, a speaker, and/or a sensor for sensing light or heat. The electronic module EM may sense an external object through the module hole MH and/or may provide a sound signal (e.g., a voice) to the outside through the module hole MH. In this case, the other components of the first and second electronic modules EM1 and EM2 may be disposed at other positions. However, embodiments of the inventive concepts are not limited thereto. In another embodiment, the electronic module EM may include at least two of the components of the first and second electronic modules EM1 and EM2. In some embodiments, the display apparatus EA may further include a transparent member disposed between the electronic module EM and the display panel DP. The transparent member may include or be an optically transparent film, such that the external input provided through the module hole MH is transmitted to the electronic module EM through the transparent member. The transparent member may be adhered to the rear surface of the display panel DP or may be disposed between the display panel DP and the electronic module EM without an additional adhesive layer. In some embodiments, the structure of the display apparatus EA may be variously modified or changed and may not be limited to one embodiment.

According to one or more embodiments of the inventive concepts, because the display panel DP includes the module hole MH, a space for providing the electronic module EM may be omitted in the peripheral area NAA. In addition, the module hole MH may be defined at (e.g., in or on) the hole area HA surrounded (e.g., around its periphery) by the active area AA, and thus, the electronic module EM may overlap with the transmission area TA and not the bezel area BZA. As a result, an area (or a size) of the bezel area BZA may be reduced to realize the display apparatus EA having a narrow bezel. In addition, when the electronic module EM is received in the module hole MH, a thin display apparatus EA (e.g., a display apparatus having a reduced thickness) may be realized.

Figure 4:
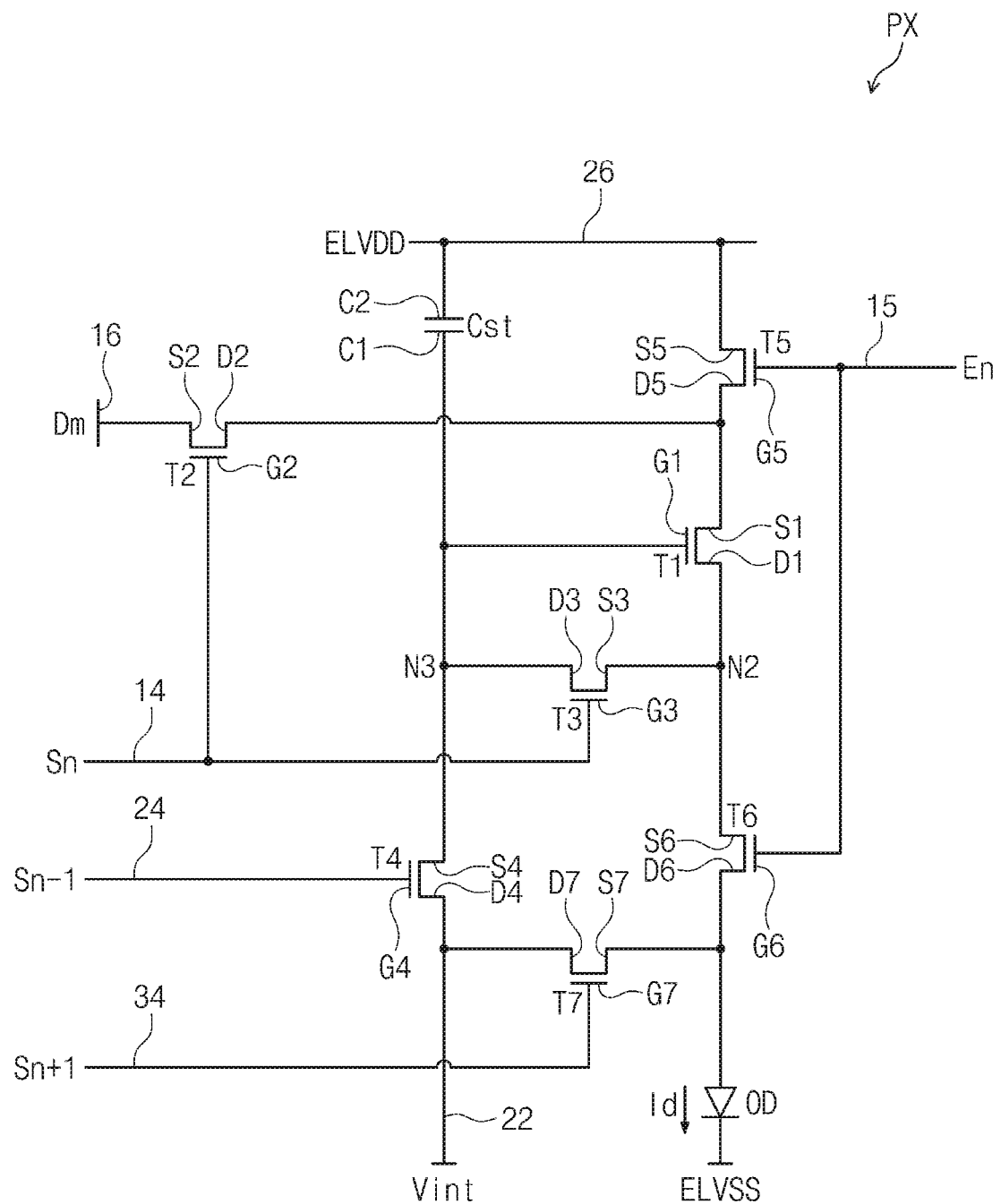
FIG. 4 is an equivalent circuit diagram illustrating a pixel of a display panel.

FIG. 4 is an equivalent circuit diagram illustrating a pixel of a display panel.

Referring to FIG. 4, a pixel PX according to an embodiment of the inventive concepts may include a plurality of transistors T1 to T7, a storage capacitor Cst, and a light emitting element (e.g., an organic light emitting diode) OD.

In some embodiments, except for the light emitting element OD, the other components (e.g., the plurality of transistors T1 to T7 and the storage capacitor Cst) of the pixel PX may be defined as a driving element.

The transistors T1 to T7 may include a driving transistor T1, a switching transistor T2, a compensation transistor T3, an initialization transistor T4, a first emission control transistor T5, a second emission control transistor T6, and a bypass transistor T7.

The pixel PX may include a first gate line 14 configured to transmit an n-th (where n is a natural number) scan signal Sn to the switching transistor T2 and the compensation transistor T3, a second gate line 24 configured to transmit an (n−1)-th scan signal Sn−1 to the initialization transistor T4, a third gate line 34 configured to transmit an (n+1)-th scan signal Sn+1 to the bypass transistor T7, an emission line 15 configured to transmit an emission control signal En to the first and second emission control transistors T5 and T6, a data line 16 configured to transmit a data signal Dm, a power line 26 configured to transmit a power voltage ELVDD, and an initialization voltage line 22 configured to transmit an initialization voltage Vint for initializing the driving transistor T1.

A gate electrode G1 of the driving transistor T1 may be connected to a first electrode C1 of the storage capacitor Cst. A source electrode S1 of the driving transistor T1 may be connected to the power line 26 via the first emission control transistor T5. A drain electrode D1 of the driving transistor T1 may be electrically connected to an anode of the light emitting element OD via the second emission control transistor T6. The driving transistor T1 may receive the data signal DM by a switching operation of the switching transistor T2, and thus, may supply a driving current Id to the light emitting element OD.

A gate electrode G2 of the switching transistor T2 may be connected to the first gate line 14. A source electrode S2 of the switching transistor T2 may be connected to the data line 16. A drain electrode D2 of the switching transistor T2 may be connected to the source electrode S1 of the driving transistor T1, and may be connected to the power line 26 via the first emission control transistor T5. The switching transistor T2 may be turned-on by the n-th scan signal Sn transmitted through the first gate line 14 to transmit the data signal Dm provided through the data line 16 to the source electrode S1 of the driving transistor T1.

A gate electrode G3 of the compensation transistor T3 may be connected to the first gate line 14. A source electrode S3 of the compensation transistor T3 may be connected to the drain electrode D1 of the driving transistor T1, and may be connected to the anode of the light emitting element OD via the second emission control transistor T6. A drain electrode D3 of the compensation transistor T3 may be connected to the first electrode C1 of the storage capacitor Cst, a source electrode S4 of the initialization transistor T4, and the gate electrode G1 of the driving transistor T1. The compensation transistor T3 may be turned-on by the n-th scan signal Sn provided through the first gate line 14 to connect the gate electrode G1 and the drain electrode D1 of the driving transistor T1 to each other. In other words, a diode connection of the driving transistor T1 may be realized by the compensation transistor T3.

A gate electrode G4 of the initialization transistor T4 may be connected to the second gate line 24. A drain electrode D4 of the initialization transistor T4 may be connected to the initialization voltage line 22. The source electrode S4 of the initialization transistor T4 may be connected to the first electrode C1 of the storage capacitor Cst, the drain electrode D3 of the compensation transistor T3, and the gate electrode G1 of the driving transistor T1. The initialization transistor T4 may be turned-on by the (n−1)-th scan signal Sn−1 provided through the second gate line 24 to transmit the initialization voltage Vint to the gate electrode G1 of the driving transistor T1, thereby initializing a voltage of the gate electrode G1 of the driving transistor T1.

A gate electrode G5 of the first emission control transistor T5 may be connected to the emission line 15. The first emission control transistor T5 may be connected between the power line 26 and the driving transistor T1. A source electrode S5 of the first emission control transistor T5 may be connected to the power line 26. A drain electrode D5 of the first emission control transistor T5 may be connected to the source electrode S1 of the driving transistor T1 and the drain electrode D2 of the switching transistor T2. The first emission control transistor T5 may be turned-on by applying the emission control signal En to the gate electrode G5 of the first emission control transistor T5, and thus, the driving current Id may flow through the light emitting element OD. The first emission control transistor T5 may determine a timing at which the driving current Id flows through the light emitting element OD.

A gate electrode G6 of the second emission control transistor T6 may be connected to the emission line 15. The second emission control transistor T6 may be connected between the driving transistor T1 and the light emitting element OD. A source electrode S6 of the second emission control transistor T6 may be connected to the drain electrode D1 of the driving transistor T1 and the source electrode S3 of the compensation transistor T3. A drain electrode D6 of the second emission control transistor T6 may be electrically connected to the anode of the light emitting element OD. The first and second emission control transistors T5 and T6 may be turned-on by the emission control signal En transmitted through the emission line 15. The second emission control transistor T6 may be turned-on by applying the emission control signal En to the gate electrode G6 of the second emission control transistor T6, and thus, the driving current Id may flow through the light emitting element OD. The second emission control transistor T6 may determine a timing at which the driving current Id flows through the light emitting element OD.

A gate electrode G7 of the bypass transistor T7 may be connected to the third gate line 34. A source electrode S7 of the bypass transistor T7 may be connected to the anode of the light emitting element OD. A drain electrode D7 of the bypass transistor T7 may be connected to the initialization voltage line 22. The bypass transistor T7 may be turned-on by the (n+1)-th scan signal Sn+1 provided through the third gate line 34 to initialize the anode of the light emitting element OD.

A second electrode C2 of the storage capacitor Cst may be connected to the power line 26. The first electrode C1 of the storage capacitor Cst may be connected to the gate electrode G1 of the driving transistor T1, the drain electrode D3 of the compensation transistor T3, and the source electrode S4 of the initialization transistor T4.

A cathode of the light emitting element OD may receive a reference voltage ELVSS. The light emitting element OD may receive the driving current Id from the driving transistor T1 to emit light. The light emitting element OD may include a light emitting material. The light emitting element OD may generate light having a color based on the light emitting material. For example, the color of the light generated from the light emitting element OD may be a red color, a green color, a blue color, or a white color.

In some embodiments, the number and/or connection relationship of the transistors T1 to T7 of the pixel PX may be variously modified or changed.

Figure 5:
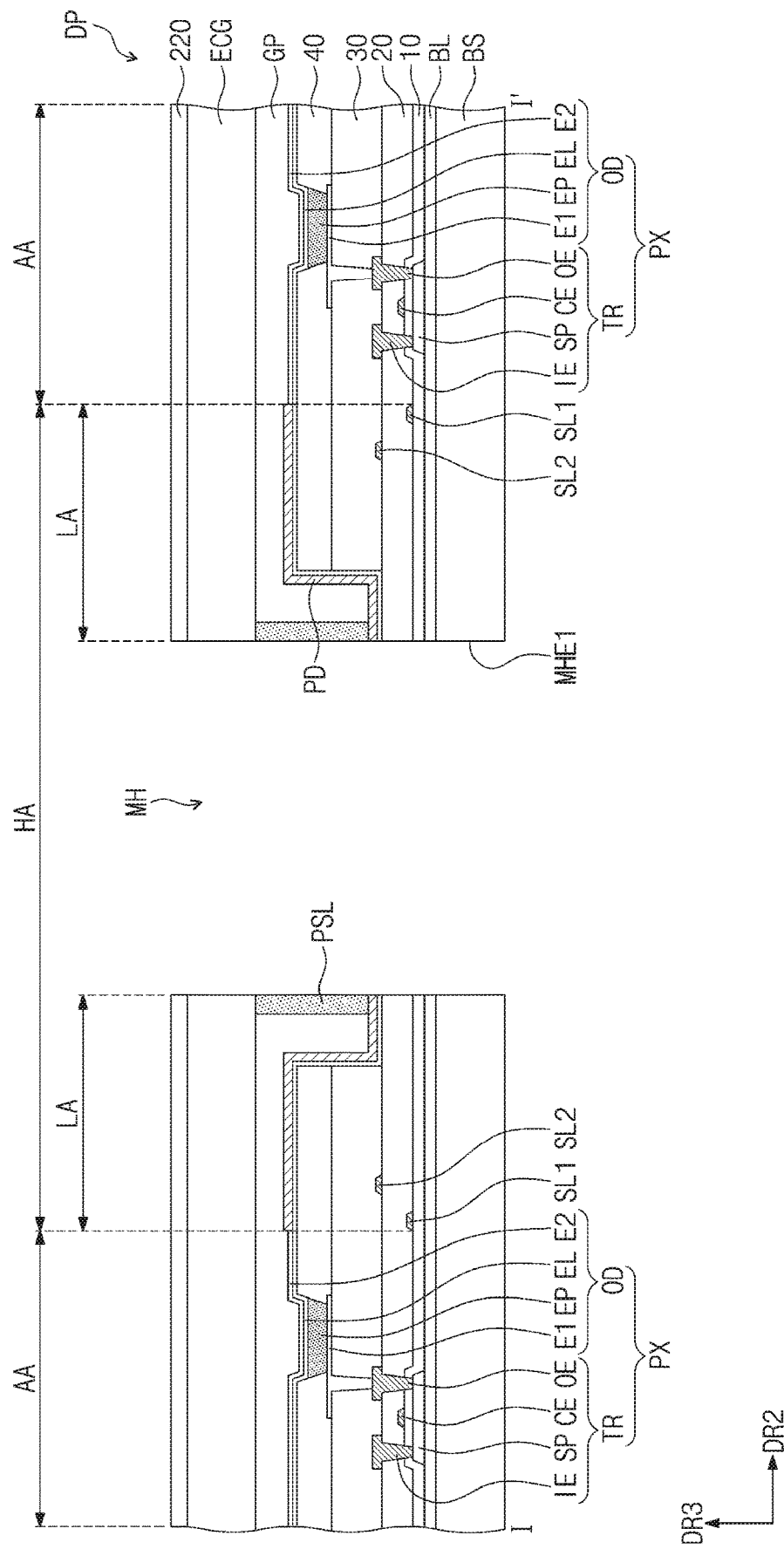
FIG. 5 is a cross-sectional view taken along the line I-I' of FIG. 2.

FIG. 5 is a cross-sectional view taken along the line I-I' of FIG. 2.

In the present embodiment, an area of the hole area HA outside (e.g., and adjacent to) the module hole MH may be defined as a margin area LA. The margin area LA may be an area for securing a margin of the module hole MH. An image may not be displayed at (e.g., in or on) the margin area LA. Signal lines bypassing the module hole MH may be disposed at (e.g., in or on) the margin area LA.

As illustrated in FIG. 5, the display panel DP may include a base substrate BS, an auxiliary layer BL, the pixel PX, a plurality of insulating layers 10, 20, 30 and 40, an encapsulation substrate ECG, and the sensing unit 220.

The base substrate BS may be an insulating substrate. For example, the base substrate BS may include a plastic substrate or a glass substrate. The auxiliary layer BL may be disposed on the base substrate BS to cover a front surface of the base substrate BS. The auxiliary layer BL may include an inorganic material. The auxiliary layer BL may include a barrier layer and/or a buffer layer. Thus, the auxiliary layer BL may prevent or substantially prevent oxygen and/or moisture from permeating into the pixel PX through the base substrate BS, and/or may reduce surface energy of the base substrate BS such that the pixel PX is stably formed on the base substrate BS.

The pixel PX may be disposed at (e.g., in or on) the active area AA. In the present embodiment, the pixel PX including a thin film transistor TR and a light emitting element OD is illustrated as an example. Each of first to fourth insulating layers 10, 20, 30 and 40 may include an organic material and/or an inorganic material, and may have a single-layer structure or a multi-layered structure.

The thin film transistor TR may include a semiconductor pattern SP, a control electrode CE, an input electrode IE, and an output electrode OE. The semiconductor pattern SP may be disposed on the auxiliary layer BL. The semiconductor pattern SP may include a semiconductor material. The control electrode CE may be spaced apart from the semiconductor pattern SP with the first insulating layer 10 interposed therebetween.

The input electrode IE and the output electrode OE may be spaced apart from the control electrode CE with the second insulating layer 20 interposed therebetween. The input electrode IE and the output electrode OE of the thin film transistor TR may penetrate (e.g., extend through) the first and second insulating layers 10 and 20 to be connected to one side portion and another side portion of the semiconductor pattern SP, respectively.

The third insulating layer 30 may be disposed on the second insulating layer 20 to cover the input electrode IE and the output electrode OE. In another embodiment, the semiconductor pattern SP may be disposed on the control electrode CE in the thin film transistor TR. In still another embodiment, the semiconductor pattern SP may be disposed on the input electrode IE and the output electrode OE. In yet another embodiment, the input electrode IE and the output electrode OE may be disposed on the same or substantially the same layer as that of the semiconductor pattern SP, and may be connected (e.g., directly connected) to the semiconductor pattern SP. The thin film transistor TR according to embodiments of the inventive concepts may have any one of various suitable structures and is not limited to a specific embodiment.

The light emitting element OD may be disposed on the third insulating layer 30. The light emitting element OD may include a first electrode E1, an emission pattern EP, a control layer EL, and a second electrode E2.

The first electrode E1 may penetrate (e.g., extend through) the third insulating layer 30 to be connected to the thin film transistor TR. In some embodiments, the display panel DP may further include a connection electrode disposed between the first electrode E1 and the thin film transistor TR. In this case, the first electrode E1 may be electrically connected to the thin film transistor TR through the connection electrode.

The fourth insulating layer 40 may be disposed on the third insulating layer 30. The fourth insulating layer 40 may include an organic material and/or an inorganic material, and may have a single-layer structure or a multi-layered structure. An opening may be defined in the fourth insulating layer 40. The opening may expose at least a portion of the first electrode E1. The fourth insulating layer 40 may include or be a pixel defining layer.

The emission pattern EP may be disposed at (e.g., in or on) the opening, and may be disposed on the first electrode E1 exposed by the opening. The emission pattern EP may include a light emitting material. For example, the emission pattern EP may include at least one of materials capable of emitting a red light, a green light, and/or a blue light. In an embodiment, the emission pattern EP may include a fluorescent material or a phosphorescent material. The emission pattern EP may include an organic light emitting material or an inorganic light emitting material. The emission pattern EP may emit light in response to a potential difference between the first electrode E1 and the second electrode E2.

The control layer EL may be disposed between the first electrode E1 and the second electrode E2. The control layer EL may be disposed adjacent to the emission pattern EP. The control layer EL may control movement of charges to improve luminous efficiency and/or life span of the light emitting element OD. The control layer EL may include at least one of a hole transfer material, a hole injection material, an electron transfer material, or an electron injection material.

In the present embodiment, the control layer EL is disposed between the emission pattern EP and the second electrode E2. However, embodiments of the inventive concepts are not limited thereto. In other embodiments, the control layer EL may be disposed between the emission pattern EP and the first electrode E1, or the control layer EL may include a plurality of layers stacked in the third direction DR3 with the emission pattern EP interposed therebetween.

The control layer EL may have any suitable shape (e.g., a single unitary body shape) that extends from the active area AA into the peripheral area NAA. The control layer EL may be provided in common to a plurality of the pixels.

The second electrode E2 may be disposed on the emission pattern EP. The second electrode E2 may be opposite to the first electrode E1.

The second electrode E2 may have any suitable shape (e.g., a single unitary body shape) disposed at (e.g., in or on) a portion of the active area AA and the peripheral area NAA. The second electrode E2 may be provided in common to the plurality of pixels. The light emitting element OD disposed at (e.g., in or on) each of the pixels may receive a common reference voltage through the second electrode E2.

The second electrode E2 may not be disposed at (e.g., in or on) the hole area HA (e.g., the margin area LA). In other words, the second electrode E2 may not be exposed by the module hole MH.

The second electrode E2 may include a transmissive conductive material or a semi-transmissive conductive material. For example, the second electrode E2 may include magnesium (Mg), silver (Ag), any other suitable material, or a combination thereof. Thus, light generated from the emission pattern EP may exit (e.g., easily exit) in the third direction DR3 through the second electrode E2. However, embodiments of the inventive concepts are not limited thereto. In another embodiment, the first electrode E1 may include a transmissive or semi-transmissive conductive material, and the light emitting element OD may be driven as a rear surface light emitting type. In still another embodiment, the light emitting element OD may be driven as a dual surface light emitting type in which light exits through both of a front surface and a rear surface.

The second electrode E2 may include a material having a relatively high reflectance. Thus, in the event that the electronic module EM is the sound output module AOM, the light emitting module LM, the light receiving module LRM, or the camera module CMM shown in FIG. 3, light exiting from under the base substrate BS, or light incident toward a region under the base substrate BS, may be reflected by the second electrode E2, and thus, performance of the electronic module EM may be reduced (e.g., deteriorated).

However, according to one or more embodiments of the inventive concepts, because the second electrode E2 is not disposed in the margin area LA, it may be possible to prevent or substantially prevent the performance of the electronic module EM from being deteriorated by reflection of light incident into (e.g., onto or on) or exiting from the periphery of the module hole MH.

The second electrode E2 may have a thickness of about 100 angstroms (Å) (e.g., about 10 nm) or less.

The display panel DP may further include a deposition preventing pattern PD. The deposition preventing pattern PD may be disposed at (e.g., in or on) the hole area HA (e.g., in the margin area LA). The deposition preventing pattern PD is not disposed at (e.g., in or on) the active area AA. The deposition preventing pattern PD may be exposed by the module hole MH. The deposition preventing pattern PD may be in contact with the control layer EL disposed at (e.g., in or on) the margin area LA.

The deposition preventing pattern PD may include ABH113 (ABH113 is a trademark of Sun Fine Chemicals of Boisar, India) or the like used as a blue organic light emitting material.

The deposition preventing pattern PD may be disposed on the same or substantially the same layer as that of the second electrode E2. A thickness of the deposition preventing pattern PD may be greater than that of the second electrode E2. The deposition preventing pattern PD may have a thickness of about 5 µm to about 10 µm.

Figure 6:
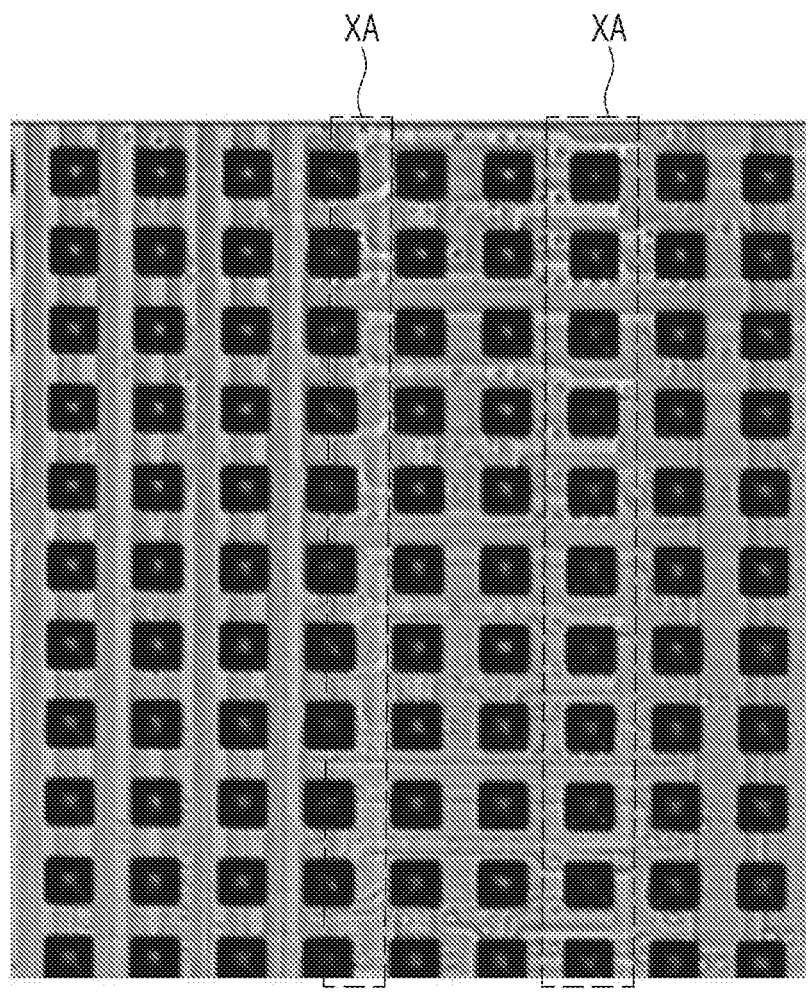
FIG. 6 is an image showing results of an experiment performed to check whether a second electrode is deposited at a position where a deposition preventing pattern is formed.

FIG. 6 is an image showing results of an experiment performed to check whether a second electrode is deposited at a position where a deposition preventing pattern is formed.

Referring to FIG. 6, ABH113 (e.g., by Sun Fine Chemicals) was deposited at (e.g., in or on) an experimental area XA, and then magnesium (Mg) or silver (Ag) for forming the second electrode was deposited using a mask for forming a mesh-shaped pattern. Here, adhesive strength between ABH113 (e.g., by Sun Fine Chemicals) and Mg/Ag is very weak. Thus, Mg/Ag was not deposited at (e.g., in or on) the area where ABH113 (e.g., by Sun Fine Chemicals) was disposed. In other words, it is recognized that a material for forming the second electrode E2 is not deposited at a position where the deposition preventing pattern PD is formed when the deposition preventing pattern PD is formed prior to forming the second electrode E2.

Accordingly, in one or more embodiments of the inventive concepts, the deposition preventing pattern PD may be disposed at (e.g., in or on) the margin area LA of the hole area HA, and thus, the second electrode E2 may be formed at (e.g., in or on) the active area AA except for the hole area HA.

The encapsulation substrate ECG may include an insulating material. For example, the encapsulation substrate ECG may include a glass substrate or a plastic substrate. According to one or more embodiments of the inventive concepts, because the display panel DP includes the encapsulation substrate ECG, the display panel DP may have improved reliability with respect to an external impact.

The encapsulation substrate ECG may be spaced apart from the second electrode E2 in the third direction DR3 by a distance (e.g., a predetermined distance). A space GP between the encapsulation substrate ECG and the second electrode E2 may be filled with air or an inert gas.

The encapsulation substrate ECG may be coupled to the base substrate BS through a sealing member PSL to seal the pixels PX. The sealing member PSL may maintain or substantially maintain a suitable distance (e.g., a predetermined distance) between the base substrate BS and the encapsulation substrate ECG disposed over the base substrate BS.

The sealing member PSL may be a component that defines an inner surface of the module hole MH. The sealing member PSL may include an organic material, for example, such as a photocurable resin or a photoplastic resin, or may include an inorganic material, for example, such as frit seal. However, embodiments of the inventive concepts are not limited thereto.

The sealing member PSL may be in contact with the deposition preventing pattern PD.

If the deposition preventing pattern PD is omitted, the second electrode E2 may extend into the margin area LA, and may be in contact with the sealing member PSL. In this case, adhesive strength between the second electrode E2 including a metal and the material of the sealing member PSL may be weak, and thus, the sealing member PSL may not be firmly fixed.

However, according to one or more embodiments of the inventive concepts, the deposition preventing pattern PD may be disposed at (e.g., in or on) the margin area LA, and may be in contact (e.g., in direct contact) with the sealing member PSL, and thus, the sealing member PSL may be firmly adhered to the deposition preventing pattern PD.

The sensing unit 220 may be disposed on the encapsulation substrate ECG. The sensing unit 220 may be operated by a capacitive method. For example, the sensing unit 220 may extract touch coordinates based on a change in capacitance of a capacitor formed by two kinds of touch lines extending in different directions and insulated from each other.

The sensing unit 220 may include a plurality of stacked conductive layers and a touch insulating layer.

The module hole MH may penetrate (e.g., extend through) the display panel DP. In the present embodiment, an inner surface MHE1 of the module hole MH may be defined by cut end surfaces (or side surfaces) of the base substrate BS, the auxiliary layer BL, the first and second insulating layers 10 and 20, the control layer EL, the deposition preventing pattern PD, the sealing member PSL, the encapsulation substrate ECG, and the sensing unit 220.

Figure 7:
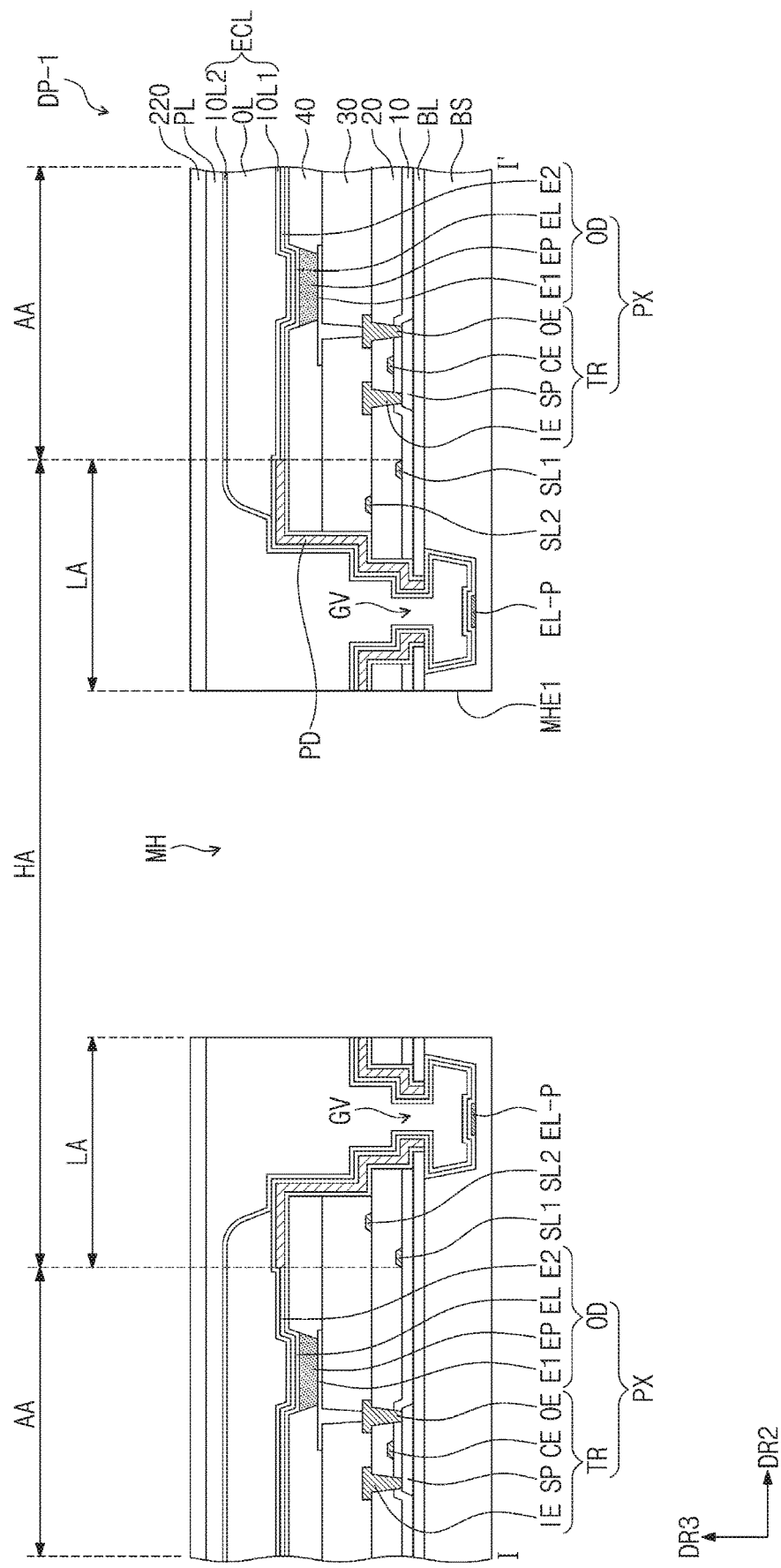
FIG. 7 is a cross-sectional view taken along the line I-I' of FIG. 2 to illustrate a display panel according to another embodiment of the inventive concepts.

FIG. 7 is a cross-sectional view taken along the line I-I' of FIG. 2 to illustrate a display panel according to another embodiment of the inventive concepts.

A display panel DP-1 of FIG. 7 may include an encapsulation layer ECL instead of the encapsulation substrate ECG of FIG. 5, as compared with the display panel DP described with reference to FIG. 5. Hereinafter, differences between the display panel DP-1 of FIG. 7 and the display panel DP of FIG. 5 will be primarily described, and redundant descriptions of the same or substantially the same components as those of the display panel DP of FIG. 5 may not be repeated for ease and convenience of description.

The display panel DP-1 may include the encapsulation layer ECL.

The encapsulation layer ECL may be disposed on the light emitting element OD to encapsulate the light emitting element OD. The encapsulation layer ECL may be provided (e.g., provided in common) on a plurality of the pixels PX. In some embodiments, a capping layer covering the second electrode E2 may be disposed between the second electrode E2 and the encapsulation layer ECL, and between the deposition preventing pattern PD and the encapsulation layer ECL.

The encapsulation layer ECL may include a first inorganic layer IOL1, an organic layer OL and a second inorganic layer IOL2, which are stacked (e.g., sequentially stacked) in the third direction DR3. However, embodiments of the inventive concepts are not limited thereto. In another embodiment, the encapsulation layer ECL may further include a plurality of inorganic layers and/or organic layers.

The first inorganic layer IOL1 may cover the second electrode E2 and the deposition preventing pattern PD. In the embodiment of FIG. 7, the first inorganic layer IOL1 may be in contact with the second electrode E2 and the deposition preventing pattern PD.

The first inorganic layer IOL1 may prevent or substantially prevent external moisture and/or oxygen from permeating into the light emitting element OD. For example, the first inorganic layer IOL1 may include silicon nitride, silicon oxide, silicon oxynitride, or a combination thereof. The first inorganic layer IOL1 may be formed by a deposition process.

The organic layer OL may be disposed on the first inorganic layer IOL1, and may be in contact with the first inorganic layer IOL1. The organic layer OL may provide a flat surface on the first inorganic layer IOL1. The organic layer OL may cover a bent portion of a top surface of the first inorganic layer IOL1, and/or a particle existing on the first inorganic layer IOL1, and thus, it may be possible to block the influence of the state of the top surface of the first inorganic layer IOL1 on components formed on the organic layer OL. In addition, the organic layer OL may relax or release stress between layers being in contact with the organic layer OL. The organic layer OL may include an organic material, and may be formed by a solution process, for example, such as a spin coating process, a slit coating process, an inkjet process, and/or any other suitable process.

The second inorganic layer IOL2 may be disposed on the organic layer OL to cover the organic layer OL. The second inorganic layer IOL2 may be stably formed on a top surface of the organic layer OL, which is relatively flat when compared with the top surface of the first inorganic layer IOL1. The second inorganic layer IOL2 may encapsulate or substantially encapsulate moisture outputted from the organic layer OL to prevent or substantially prevent the moisture from being provided to the outside. For example, the second inorganic layer IOL2 may include silicon nitride, silicon oxide, silicon oxynitride, or a combination thereof. The second inorganic layer IOL2 may be formed by a deposition process or any other suitable process.

A planarization layer PL may be disposed on the encapsulation layer ECL. The planarization layer PL may cover a front surface (e.g., a non-uniform front surface) of the encapsulation layer ECL to provide a flat surface at (e.g., in or on) the active area AA. The sensing unit 220 may be disposed on the planarization layer PL. In the present embodiment, an inner surface MHE1 of the module hole MH may be defined by cut end surfaces (or side surfaces) of the base substrate BS, the auxiliary layer BL, the first insulating layer 10, the second insulating layer 20, the control layer EL, the deposition preventing pattern PD, the first inorganic layer IOL1, the second inorganic layer IOL2, the planarization layer PL, and the sensing unit 220.

In the display panel DP-1 according to the present embodiment, a recess pattern GV may be formed in the hole area HA. The recess pattern GV may be recessed from the front surface of the display panel DP-1, and may be formed by removing portions of some of the components of the display panel DP-1. For example, the recess pattern GV may not penetrate (e.g., extend through) the display panel DP-1, unlike the module hole MH. Thus, a rear surface of the base substrate BS overlapping with the recess pattern GV may not be opened by (or may not have an opening corresponding to) the recess pattern GV.

In the present embodiment, the base substrate BS may have flexibility. For example, the base substrate BS may include a resin such as polyimide.

The recess pattern GV may penetrate at least one of the components adjacent to the module hole MH and disposed under the encapsulation layer ECL, while leaving at least a portion of the base substrate BS. In the present embodiment, the recess pattern GV may be formed by a through-region formed in the auxiliary layer BL and a recess region formed in the base substrate BS. The through-region and the recess region may be connected to (e.g., and/or overlap with) each other. An inner surface of the recess pattern GV may be formed by the first inorganic layer IOL1 and the second inorganic layer IOL2, which may cover an inner surface of the through-region formed in the auxiliary layer BL and an inner surface of the recess region formed in the base substrate BS. In the present embodiment, the inner surface of the recess pattern GV may be provided by the second inorganic layer IOL2.

The recess pattern GV may surround (e.g., around a periphery of) the module hole MH when viewed in a plan view (e.g., viewed in a direction normal to the front surface of the display apparatus EA or on a plane parallel to the front surface of the display apparatus EA). The recess pattern GV may overlap with the margin area LA.

The recess pattern GV may have an undercut shape. For example, in the recess pattern GV, an inner side surface (e.g., an edge of a side) of the auxiliary layer BL may protrude from an inner side surface of the base substrate BS.

The display panel DP-1 may further include an organic pattern EL-P disposed at (e.g., in or on) the recess pattern GV. The organic pattern EL-P may include the same or substantially the same material as that of the control layer EL. Alternatively, the organic pattern EL-P may include the same or substantially the same material as that of the deposition preventing pattern PD. The organic pattern EL-P may have a single-layer structure or a multi-layered structure.

The organic pattern EL-P may be spaced apart from the control layer EL and the deposition preventing pattern PD, and may be disposed at (e.g., in or on) the recess pattern GV. The organic pattern EL-P may be covered by the first inorganic layer IOL1, and thus, may not be exposed to the outside.

According to one or more embodiments of the inventive concepts, the recess pattern GV may block a continuity of the control layer EL between the side surface of the module hole MH and the active area AA. The control layer EL may be cut at (e.g., in or on) an area overlapping with the recess pattern GV. The control layer EL may be a path through which an external contaminant (e.g., moisture or air) moves. The path through which moisture or air moves from a layer (e.g., the control layer EL) exposed by the module hole MH to the pixel PX via the hole area HA may be blocked by the recess pattern GV. Thus, reliability of the display panel DP-1 in which the module hole MH is formed may be improved.

In another embodiment, the recess pattern GV may be provided in a plurality at (e.g., in or on) the margin area LA of the display panel DP-1, and the plurality of recess patterns GV may be spaced apart from each other. In still another embodiment, the recess pattern GV may be filled with a portion of the organic layer OL. In yet another embodiment, the recess pattern GV may be omitted from the display panel DP-1. However, the inventive concepts are not limited to one of the embodiments.

FIGS. 8A-8E are cross-sectional views illustrating a method of manufacturing a display apparatus according to the embodiment of FIG. 5.

Figure 8A:
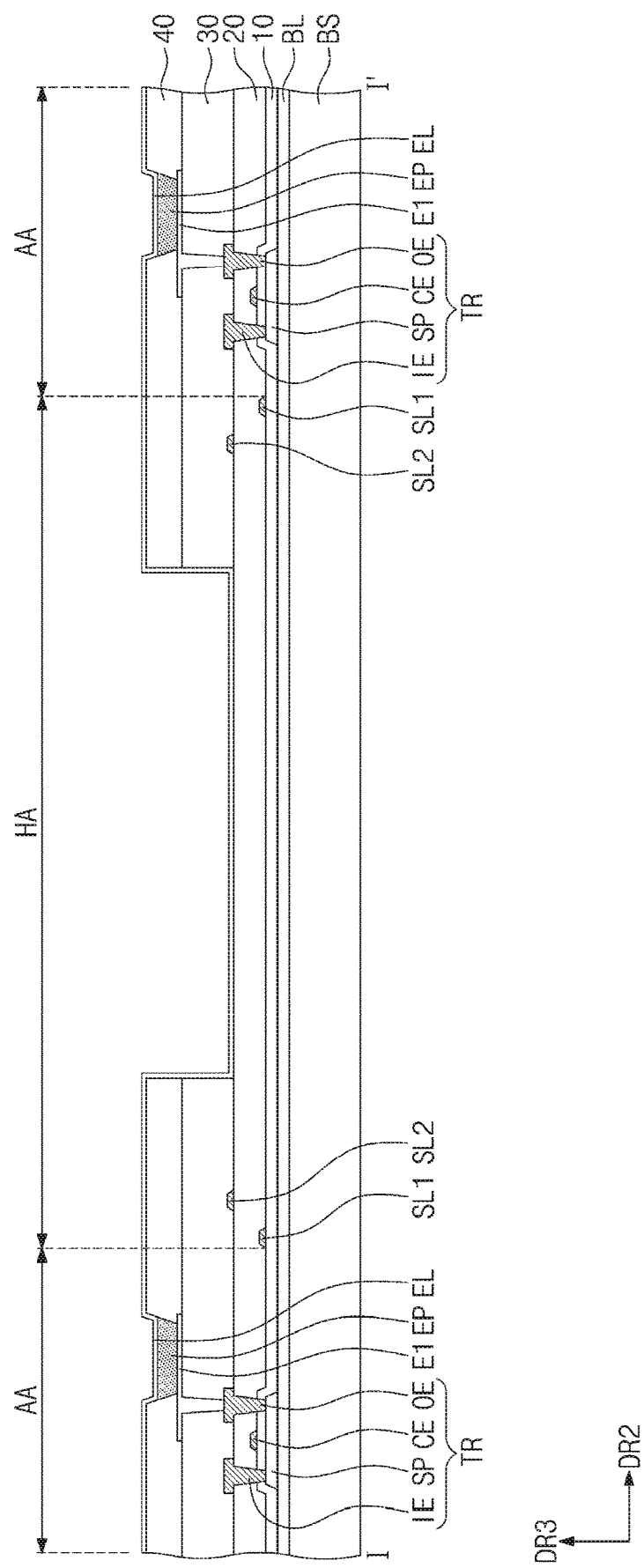
FIGS. 8A-8E are cross-sectional views illustrating a method of manufacturing a display apparatus according to the embodiment of FIG. 5.

Referring to FIG. 8A, an auxiliary layer BL, a thin film transistor TR, first to fourth insulating layers 10, 20, 30 and 40, a first electrode E1 and an emission pattern EP may be formed on a base substrate BS. Any suitable process may be used to form the layers as would be understood by those skilled in the art. Portions of the third and fourth insulating layers 30 and 40 at the hole area HA may be removed to expose the second insulating layer 20. Thereafter, a control layer EL may be formed on the emission pattern EP. The control layer EL may be formed on (e.g., entirely on) the second insulating layer 20 and the fourth insulating layer 40.

Figure 8B:
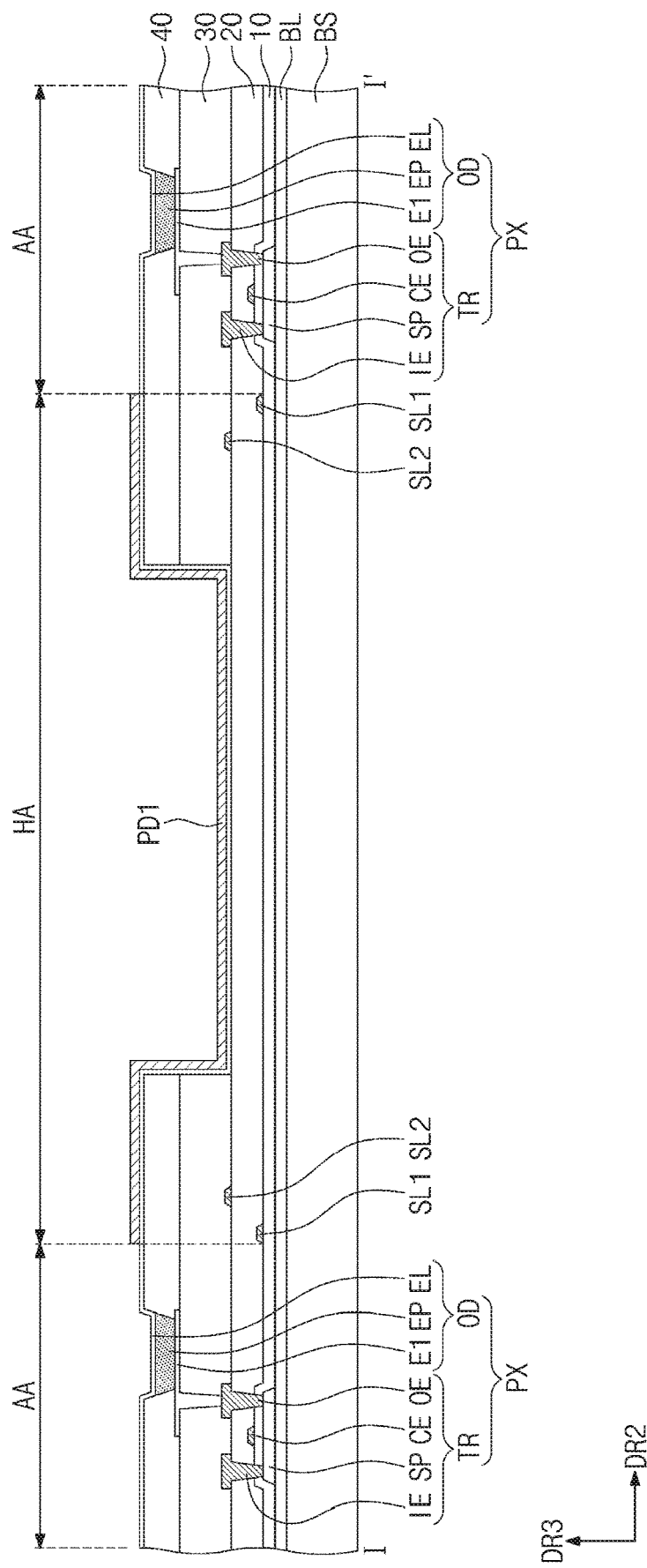

Referring to FIG. 8B, a deposition preventing layer PD1 may be subsequently formed on the control layer EL. The deposition preventing layer PD1 may be formed to overlap with the hole area HA.

In an example embodiment, ABH113 (e.g., by Sun Fine Chemicals) or the like may be used as a colored light emitting material (e.g., a blue organic light emitting material), and may be deposited and then patterned to form the deposition preventing layer PD1. The deposition preventing layer PD1 may have any suitable thickness as would be appreciated by those skilled in the art. For example, the deposition preventing layer PD1 may have a thickness of about 5 µm to about 10 µm.

Figure 8C:
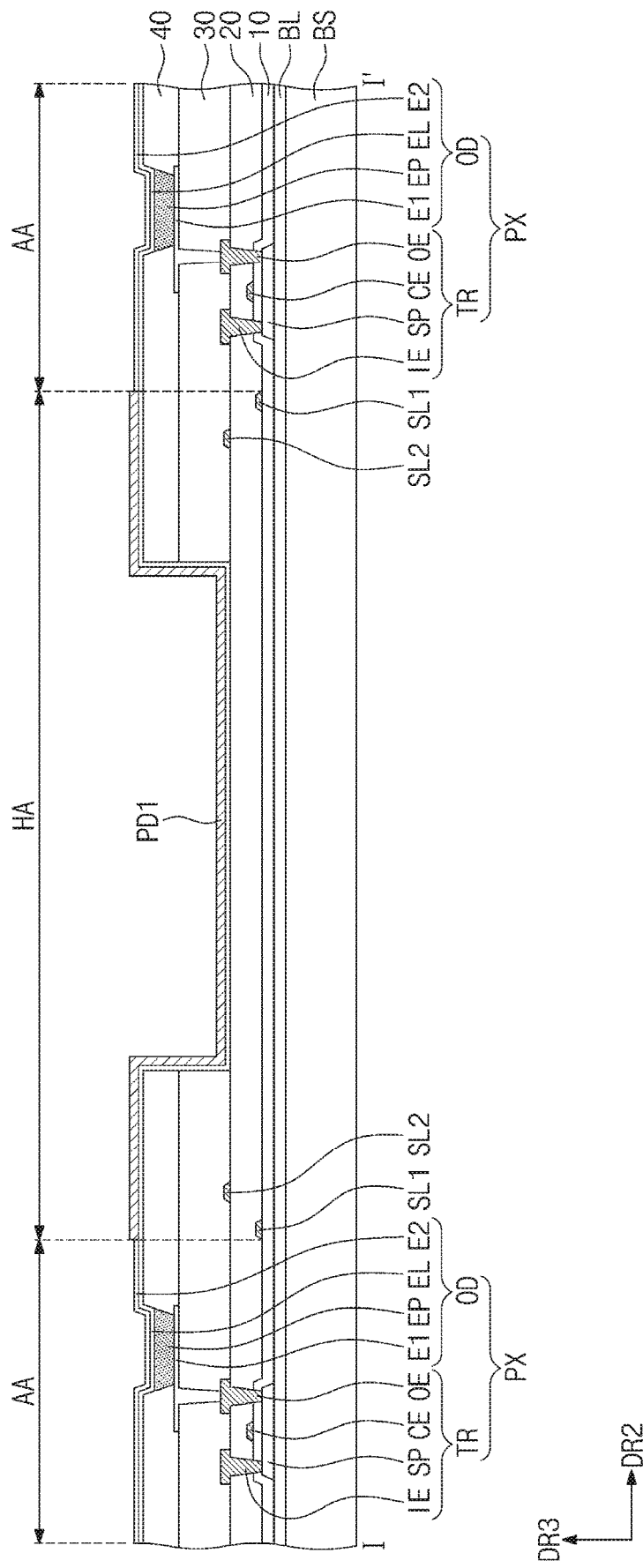

Referring to FIG. 8C, a second electrode E2 may be formed on the control layer EL. The second electrode E2 may include a transmissive conductive material or a semi-transmissive conductive material. For example, the second electrode E2 may include magnesium (Mg), silver (Ag), or a combination thereof.

The second electrode E2 may be formed by depositing (e.g., entirely depositing) a conductive material. The conductive material is not deposited at a position where the deposition preventing layer PD1 is formed. Thus, the second electrode E2 may not overlap with the hole area HA at (e.g., in or on) which the deposition preventing layer PD1 is formed. Because the second electrode E2 is formed, a light emitting element OD including the first electrode E1, the emission pattern EP, the control layer EL, and the second electrode E2 may be completed.

Figure 8D:
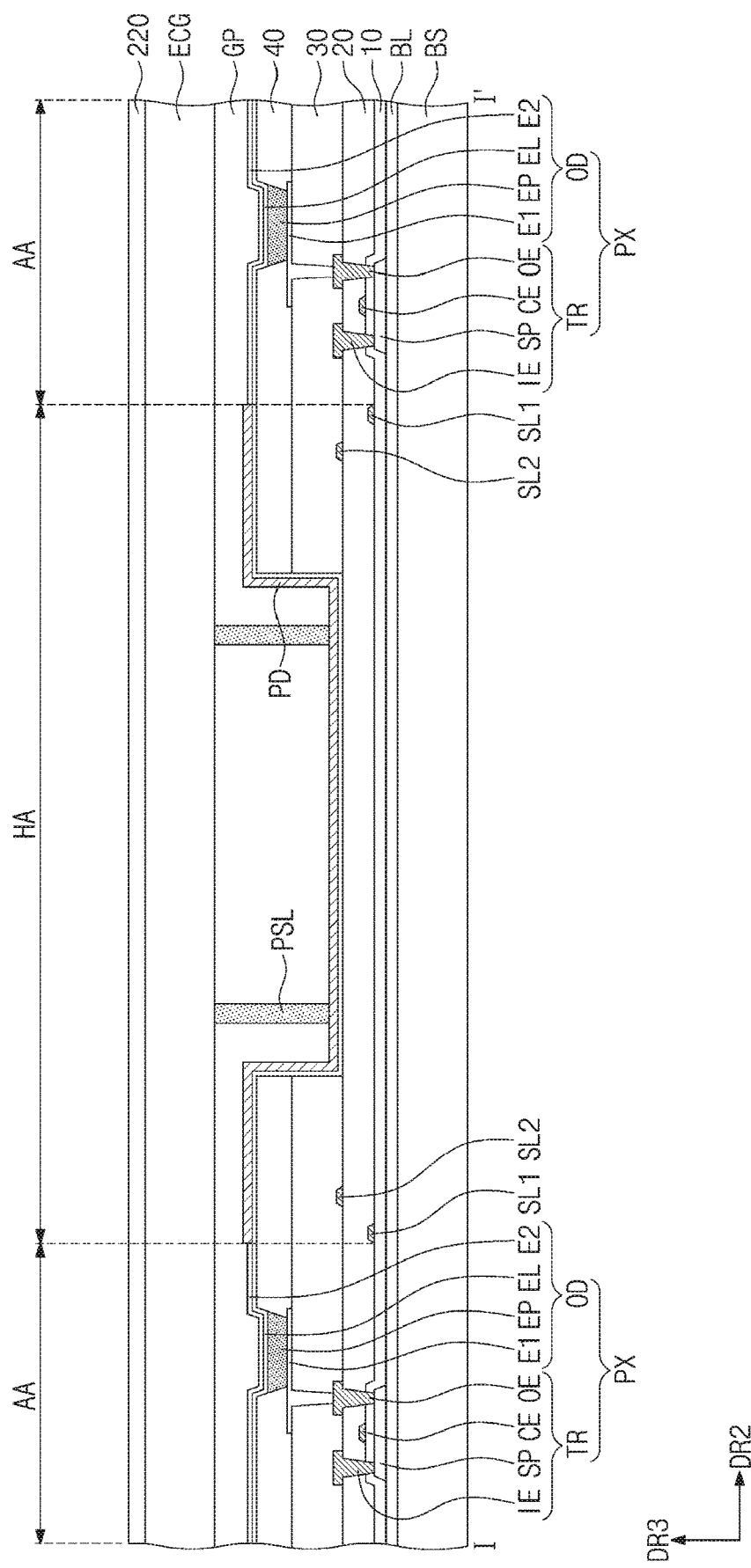

Referring to FIG. 8D, an encapsulation substrate ECG may be disposed on the base substrate BS having the light emitting element OD. The encapsulation substrate ECG may be coupled to the base substrate BS having the light emitting element OD and the deposition preventing layer PD1 by a sealing member PSL interposed therebetween. The sealing member PSL may be hardened by laser light that is irradiated through the encapsulation substrate ECG. A sensing unit (e.g., a sensor) 220 may be adhered to a top surface of the encapsulation substrate ECG before coupling the encapsulation substrate ECG to the base substrate BS. However, embodiments of the inventive concepts are not limited thereto. In another embodiment, the sensing unit 220 may be adhered to the top surface of the encapsulation substrate ECG after coupling the encapsulation substrate ECG to the base substrate BS.

Figure 8E:
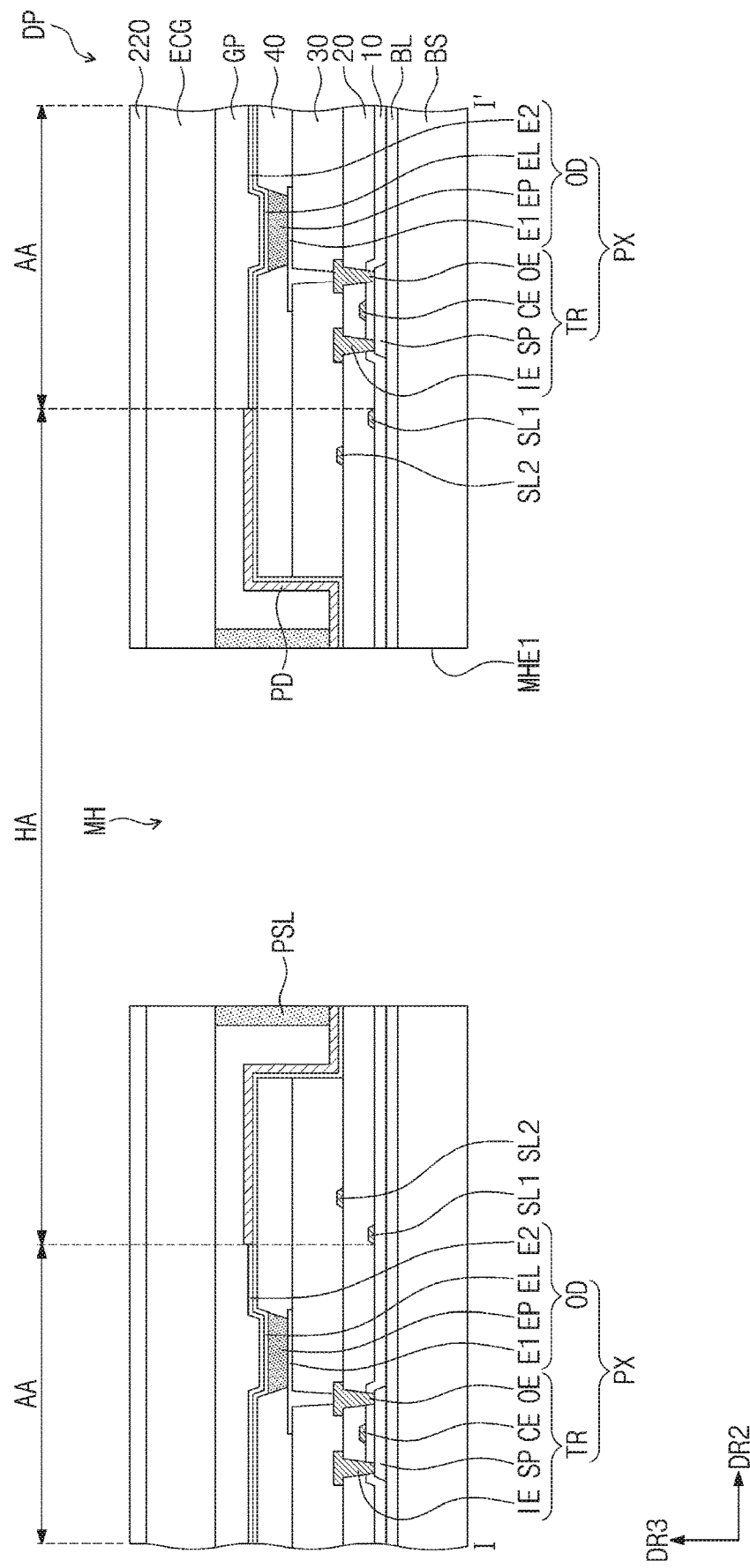

Referring to FIG. 8E, a module hole MH may be formed at (e.g., in or on) the encapsulation substrate ECG and the base substrate BS that are coupled to each other. The module hole MH may be formed by a laser cutting process. According to the process of FIG. 8E, a deposition preventing pattern PD may be formed and a display panel DP may be formed.

Figure 9:
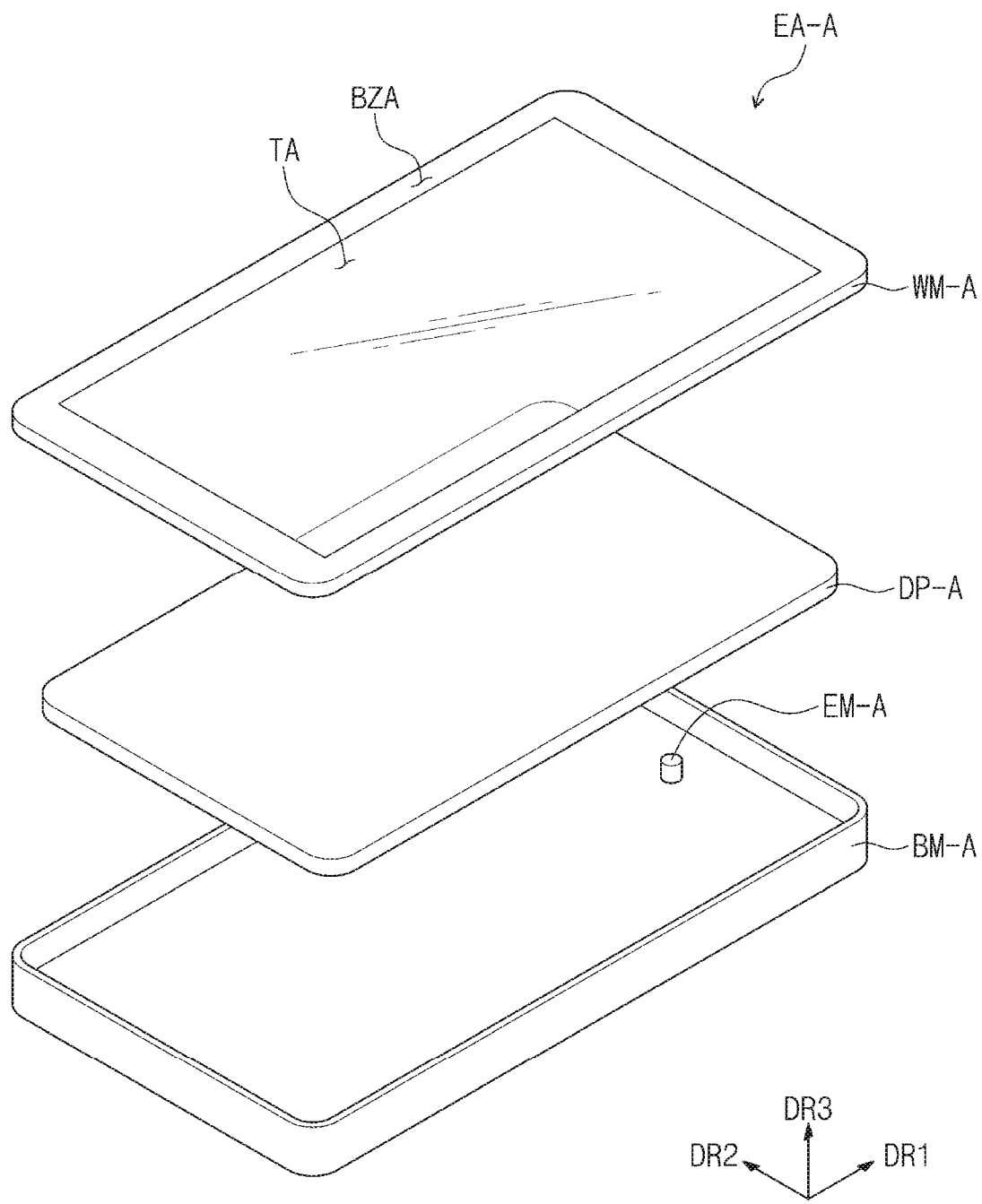
FIG. 9 is an exploded perspective view illustrating an electronic device according to an embodiment of the inventive concepts.
Figure 10A:
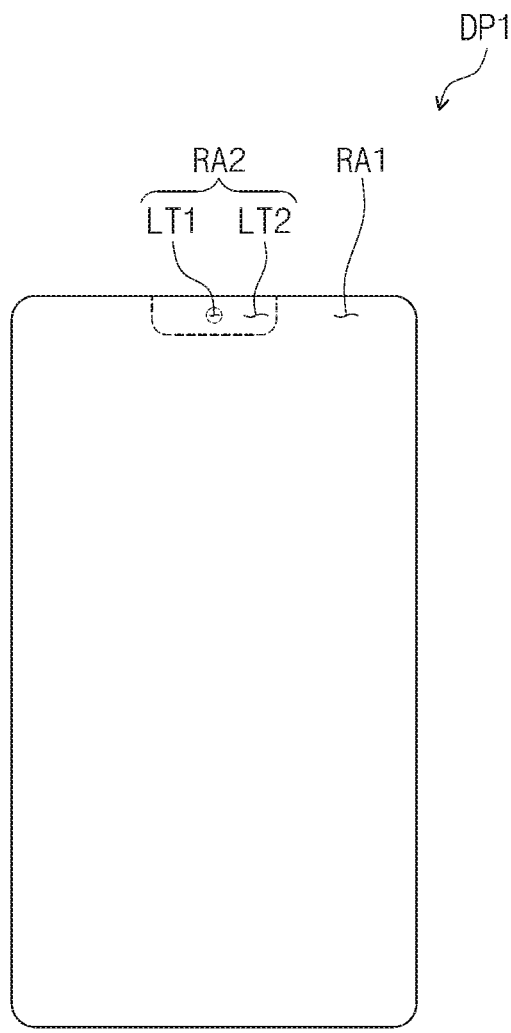
FIG. 10A is a plan view schematically illustrating a display panel according to an embodiment of the inventive concepts.
Figure 10B:
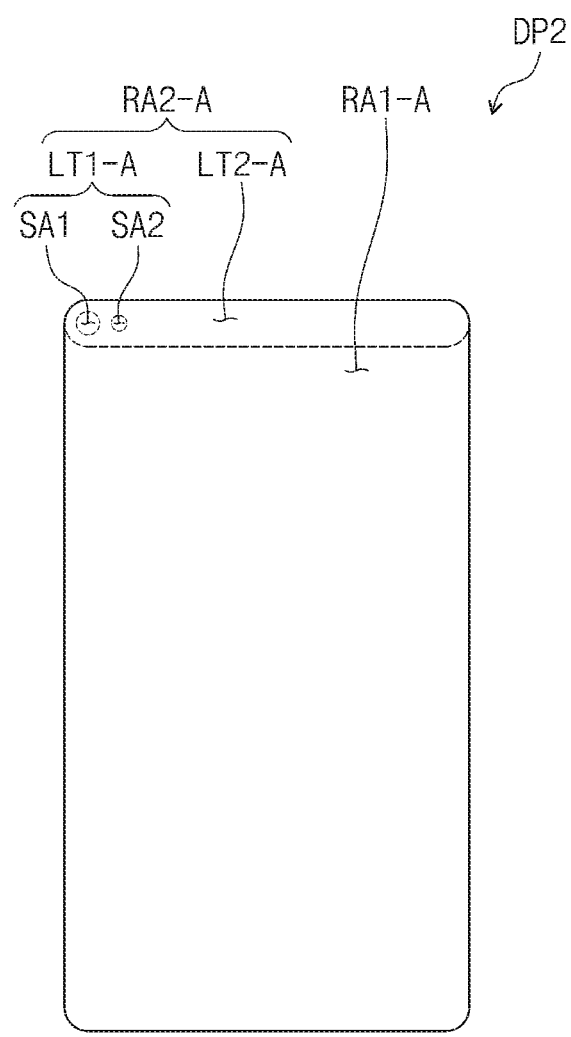
FIG. 10B is a plan view schematically illustrating a display panel according to an embodiment of the inventive concepts.

FIG. 9 is an exploded perspective view illustrating an electronic device according to an embodiment of the inventive concepts. FIG. 10A is a plan view schematically illustrating a display panel according to an embodiment of the inventive concepts. FIG. 10B is a plan view schematically illustrating a display panel according to an embodiment of the inventive concepts. Hereinafter, the same or substantially the same/similar components as those in the embodiments of FIGS. 1 to 7 will be indicated by the same or substantially the same/similar reference designators, and thus, redundant descriptions of the same or substantially the same/similar components and features as those described with reference to the embodiments of FIGS. 1 to 7 may not be repeated.

Referring to FIG. 9, an electronic device EA-A according to the present embodiment may include a display panel DP-A, a window member WM-A, an electronic module (e.g., an electronic component or device) EM-A, and a receiving member (e.g., a housing or case) BM-A.

Unlike the display panel DP of FIG. 2, the module hole MH that physically penetrates (e.g., extends through) the display panel DP may be omitted from the display panel DP-A according to the present embodiment. Instead of the module hole MH of FIG. 2, the display panel DP-A according to the present embodiment may include an area that overlaps with the electronic module EM-A, and that has a light transmittance greater than that of another area adjacent to the area. Thus, the display panel DP-A may not be physically penetrated, and the electronic module EM-A may be disposed under the display panel DP-A.

In FIG. 9, a single electronic module EM-A is shown disposed at a center (or central area) of a top end portion of the electronic device EA-A. However, embodiments of the inventive concepts are not limited thereto. A number, a position, and/or a shape of the electronic module EM-A may be variously modified or changed.

Display panels DP1 and DP2 that are schematically illustrated in FIGS. 10A and 10B, respectively, are embodiments of the display panel DP-A of FIG. 9.

Referring to FIG. 10A, the display panel DP1 according to an embodiment may include a first display area RA1 and a second display area RA2. The first display area RA1 may surround at least a portion (e.g., a peripheral portion) of the second display area RA2.

The second display area RA2 may include a first transmission part LT1 and a second transmission part LT2. In an embodiment, the first transmission part LT1 may be defined as an area of the display panel DP1 that overlaps with the electronic module EM-A. The second transmission part LT2 may surround (e.g., around a periphery of) the first transmission part LT1. The second transmission part LT2 may form a boundary with the first display area RA1.

According to an embodiment of the inventive concepts, a light transmittance of the second display area RA2 of the display panel DP1 may be greater than a light transmittance of the first display area RA1 of the display panel DP1. Thus, the second display area RA2 may include areas at (e.g., in or on) which some components of the display panel DP1 are not disposed or are omitted.

According to an embodiment of the inventive concepts, the light transmittance of the second display area RA2 overlapping with the electronic module EM-A may be greater than the light transmittance of the first display area RA1 adjacent to the second display area RA2 in the display panel DP1, and thus, performance of the electronic module EM-A may be improved.

Referring to FIG. 10B, the display panel DP2 according to an embodiment may include a first display area RA1-A and a second display area RA2-A. The second display area RA2-A may include a first transmission part LT1-A and a second transmission part LT2-A. The first transmission part LT1-A may include a first part SA1 and a second part SA2. The number and/or shapes of the first and second parts SA1 and SA2 included in the first transmission part LT1-A may be variously modified to correspond to the number and/or shapes of one or more of the electronic modules EM-A disposed under the display panel DP-A. The first part SA1 and the second part SA2 have circular shapes having different sizes in FIG. 10B. However, embodiments of the inventive concepts are not limited thereto. In other embodiments, each of the first and second parts SA1 and SA2 may have a polygonal shape, an elliptical shape, or any other suitable shape.

In the present embodiment, the first display area RA1-A and the second display area RA2-A may be arranged along a first direction DR1. In addition, the second display area RA2-A may have a bar shape extending in a second direction DR2.

Figure 11A:
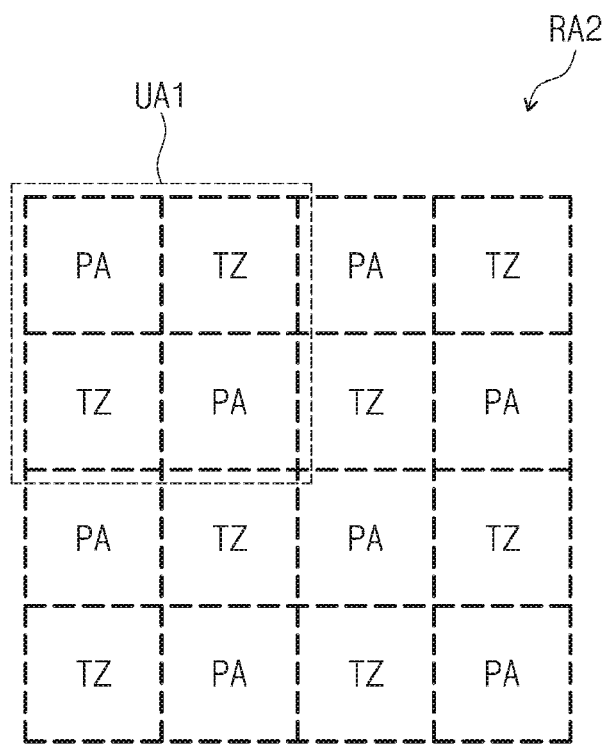
FIG. 11A is an enlarged plan view illustrating an area of a display panel according to an embodiment of the inventive concepts.
Figure 11B:
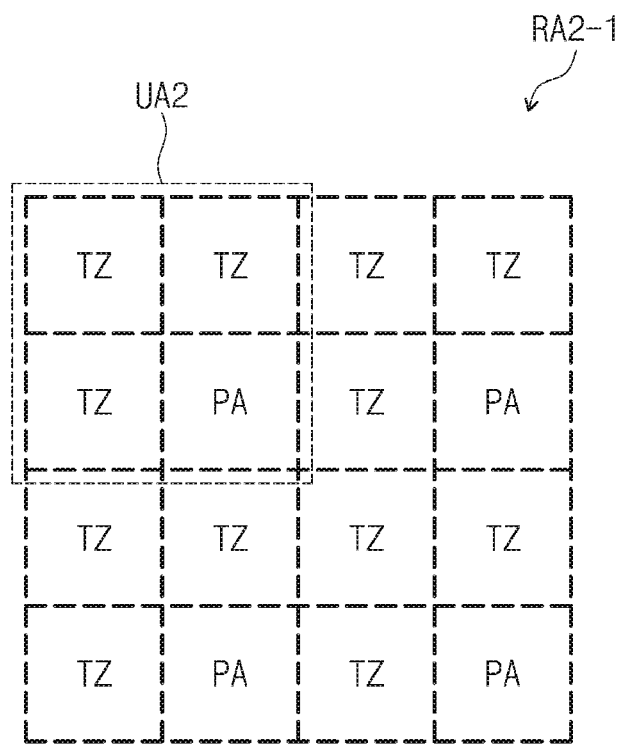
FIG. 11B is an enlarged plan view illustrating an area of a display panel according to an embodiment of the inventive concepts.
Figure 12:
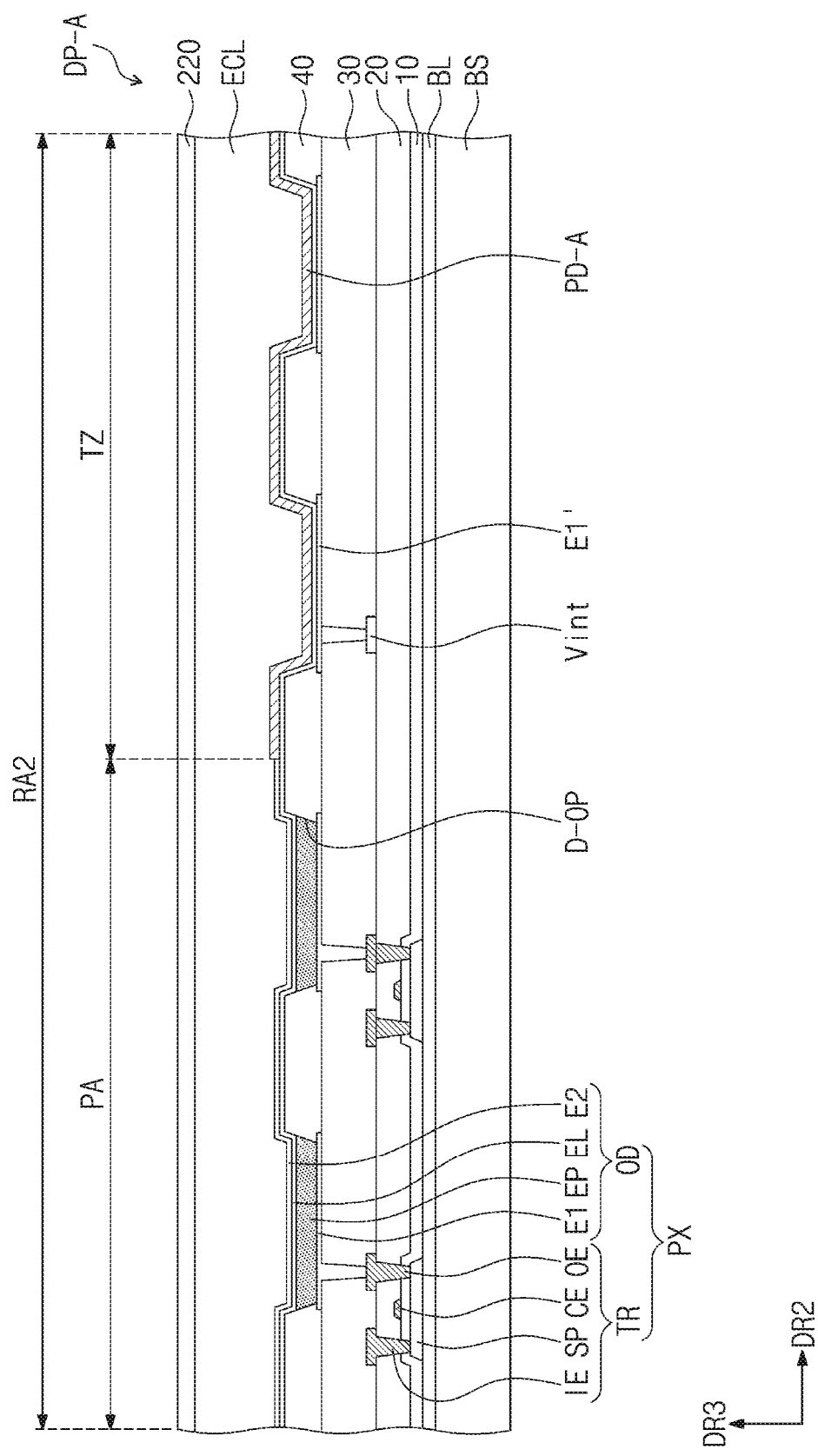
FIG. 12 is a cross-sectional view illustrating an area of a display panel according to an embodiment of the inventive concepts.

FIG. 11A is an enlarged plan view illustrating an area of a display panel according to an embodiment of the inventive concepts. FIG. 11B is an enlarged plan view illustrating an area of a display panel according to an embodiment of the inventive concepts. FIG. 12 is a cross-sectional view illustrating an area of a display panel according to an embodiment of the inventive concepts.

Referring to FIG. 11A, the second display area RA2 according to an embodiment may include light emitting zones PA and transmission zones TZ, which may be alternately arranged. The light emitting zones PA and the transmission zones TZ may be included in each of the first and second transmission parts LT1, LT1-A, LT2, and LT2-A of FIGS. 10A and 10B.

The light emitting zones PA may be zones in which emission patterns EP (described in more detail below) are disposed, and the transmission zones TZ may be zones in which some components of the display panel DP-A are not disposed or are omitted. Thus, light transmittances of the transmission zones TZ may be greater than those of the light emitting zones PA.

In the present embodiment, the light emitting zones PA and the transmission zones TZ may be alternately arranged in the second display area RA2. In the present embodiment, two light emitting zones PA and two transmission zones TZ, which are arranged in a grid or matrix form, may be defined as a unit area UA1.

Thus, in the present embodiment, a ratio of the light emitting zones PA to the transmission zones TZ per the unit area UA1 may be 50:50. A transmittance per the unit area UA1 may be modified by adjusting the ratio of the light emitting zones PA to the transmission zones TZ in the unit area UA1.

According to some embodiments, the first display areas RA1 and RA1-A of FIGS. 10A and 10B may include only the light emitting zones PA. For example, unlike the second display areas RA2 and RA2-A of FIGS. 10A and 10B, the first display areas RA1 and RA1-A of FIGS. 10A and 10B may include one or more of the light emitting zones PA, but not the transmission zones TZ.

Referring to FIG. 11B, each of light emitting zones PA of a second display area RA2-1 according to an embodiment may be surrounded by transmission zones TZ. For example, in some embodiments, corresponding ones of the transmission zones TZ may be arranged around a periphery of a corresponding light emitting zone PA to surround the corresponding light emitting zone PA. The light emitting zones PA and the transmission zones TZ may be included in each of the first and second transmission parts LT1, LT1-A, LT2 and LT2-A of FIGS. 10A and 10B.

In the present embodiment, a ratio of the light emitting zones PA to the transmission zones TZ in a unit area UA2 may be 20:80. Thus, when the camera module CMM (e.g., see FIG. 3) of the electronic module EM-A is disposed under the display panel DP-A, the display panel DP-A may include the second display area RA2-1 having a light transmittance that is greater than that of an adjacent area, and thus, efficiency of the electronic module EM-A may be improved.

Referring to FIG. 12, the display panel DP-A according to the present embodiment may include the base substrate BS, the auxiliary layer BL, the pixel PX, the plurality of the insulating layers 10, 20, 30 and 40, the encapsulation layer ECL, and the sensing unit (e.g., a sensor) 220. The second display area RA2 of the display panel DP-A may include the light emitting zone PA and the transmission zone TZ. The light transmittance of the transmission zone TZ may be greater than the light transmittance of the light emitting zone PA. The first display areas RA1 and RA1-A of FIGS. 10A and 10B may include only the light emitting zones PA. For example, unlike the second display area RA2 of FIG. 12, the first display areas RA1 and RA1-A of FIGS. 10A and 10B may include one or more of the light emitting zones PA, but not the transmission zones TZ.

The first electrode E1 may be disposed at (e.g., in or on) the light emitting zone PA, and may penetrate (e.g., extend through) the third insulating layer 30 to be connected to the thin film transistor TR. A first electrode E1' that is disposed at (e.g., in or on) the transmission zone TZ may be spaced apart from the thin film transistor TR. At least one of the first electrodes (e.g., E1') that is disposed at (e.g., in or on) the transmission zone TZ may be connected to the initialization voltage line Vint, and thus, may be supplied with the same or substantially the same voltage as that of the initialization voltage line Vint. Therefore, the first electrode (e.g., E1') that is disposed in the transmission zone TZ may be floated to prevent or substantially prevent the first electrode (e.g., E1') from being charged with a peripheral current (e.g., a current of a component that is adjacent to or near the first electrode E1'). The first electrodes E1 overlapping with the light emitting zone PA may be exposed through corresponding display openings D-OP defined in the fourth insulating layer 40.

The emission pattern EP may be disposed at (e.g., in or on) the display opening D-OP. The fourth insulating layer 40 may be a pixel defining layer. In the present embodiment, the light emitting zone PA may be defined as a zone at (e.g., in or on) which the emission pattern EP of the pixel PX is disposed.

The control layer EL may be disposed between the first electrode E1 and the second electrode E2. For example, the control layer EL may be disposed adjacent to the emission pattern EP. The control layer EL may be disposed in both the light emitting zone PA and the transmission zone TZ. However, embodiments of the inventive concepts are not limited thereto. In another embodiment, the control layer EL may be disposed at (e.g., in or on) the light emitting zone PA but may not be disposed at (e.g., in or on) the transmission zone TZ.

In the present embodiment, the second electrode E2 may be disposed at (e.g., in or on) the light emitting zone PA, but may not be disposed at (e.g., in or on) the transmission zone TZ. Thus, the second electrode E2 may be disposed on the first electrodes E1 that overlap with the light emitting zone PA, but not on the first electrodes E1' that overlap with the transmission zone TZ.

The second electrode E2 may include a material having a relatively high reflectance. Thus, when the electronic module EM-A includes the sound output module AOM, the light emitting module LM, the light receiving module LRM, and/or the camera module CMM of FIG. 3, light exiting from under the base substrate BS or light incident toward a region under the base substrate BS may be reflected by the second electrode E2, and thus, performance of the electronic module EM-A may be deteriorated.

However, according to one or more embodiments of the inventive concepts, because the second electrode E2 is not disposed at (e.g., in) the transmission zone TZ, it may be possible to prevent or substantially prevent the performance of the electronic module EM-A from being deteriorated by reflection of light incident to or exiting from the second display area RA2.

The second electrode E2 may have any suitable thickness, for example, a thickness of about 100 Å or less.

In the present embodiment, the display panel DP-A may further include a deposition preventing pattern PD-A. The deposition preventing pattern PD-A may be disposed at (e.g., in or on) the transmission zone TZ, but may not be disposed at (e.g., in or on) the light emitting zone PA. The deposition preventing pattern PD-A may be in contact with the control layer EL that is disposed at (e.g., in or on) the transmission zone TZ.

The deposition preventing pattern PD-A may include ABH113 (e.g., by Sun Fine Chemicals) or the like that is used as a blue organic light emitting material.

The deposition preventing pattern PD-A may be disposed on the same or substantially the same layer as that of the second electrode E2. The deposition preventing pattern PD-A may be disposed at (e.g., in or on) only the transmission zone TZ. For example, the deposition preventing pattern PD-A may be disposed at (e.g., in or on) the transmission zone TZ, but not at (e.g., in or on) the light emitting zone PA. Thus, the deposition preventing pattern PD-A may be disposed on the first electrodes E1' that overlap with the transmission zone TZ, but not on the first electrodes E1 that overlap with the light emitting zone PA.

A thickness of the deposition preventing pattern PD-A may be greater than that of the second electrode E2. For example, the deposition preventing pattern PD-A may have a thickness of about 5 μm to about 10 μm.

According to the present embodiment, the deposition preventing pattern PD-A may be disposed at (e.g., in or on) the transmission zone TZ, but not at (e.g., in or on) the light emitting zone PA, and thus, the second electrode E2 may be disposed at (e.g., in or on) the light emitting zone PA, but may not be disposed at (e.g., in or on) the transmission zone TZ. As a result, because the second display area RA2 includes the light emitting zone PA for providing light generated from the emission pattern EP and the transmission zone TZ having the light transmittance that is greater than that of the light emitting zone PA, the performance of the electronic module EM-A (e.g., see FIG. 9) and/or visibility may be improved, even though the electronic module EM-A is disposed under (e.g., and covered by) the display panel DP-A.

Figure 13:
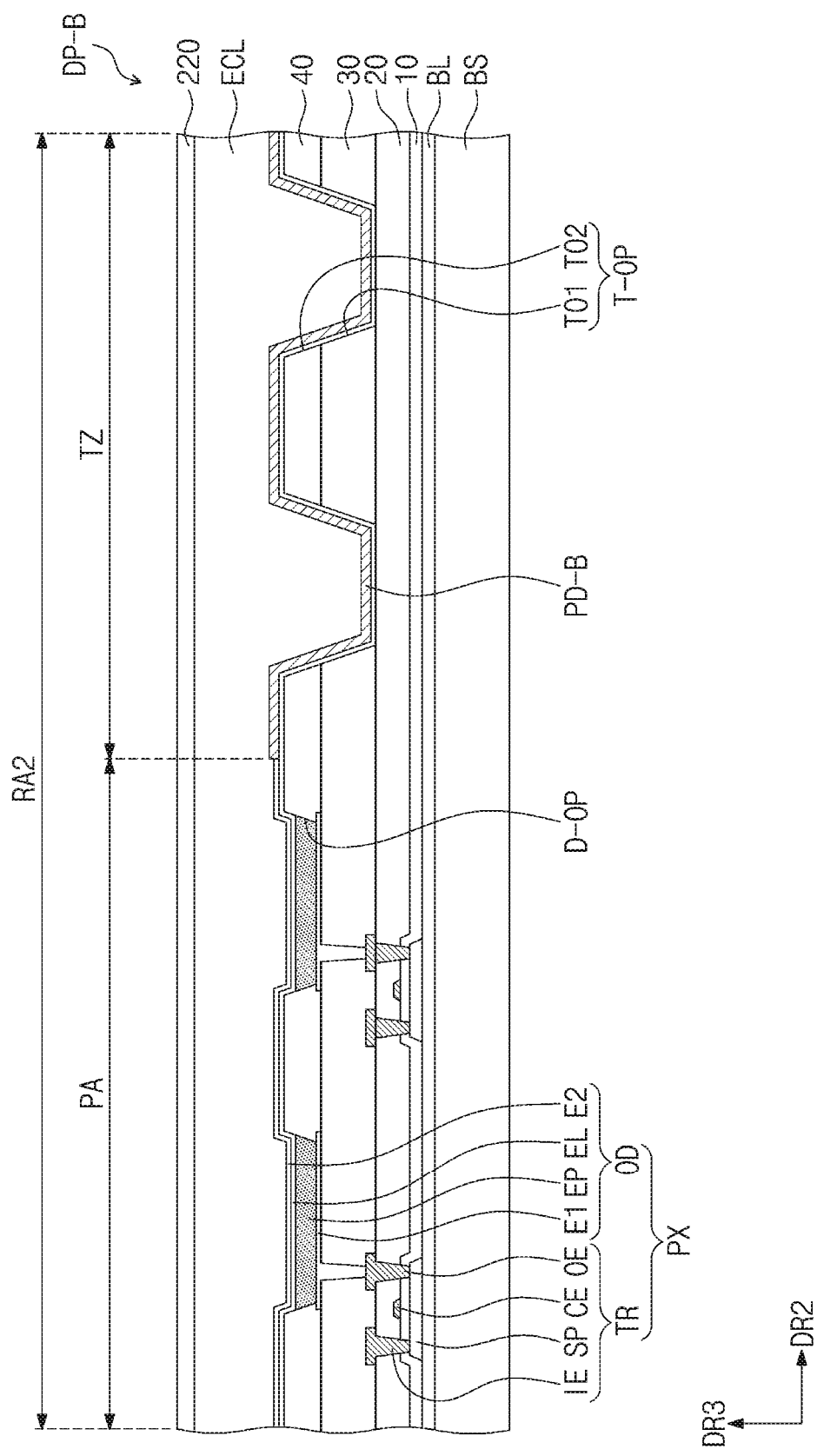
FIG. 13 is a cross-sectional view illustrating an area of a display panel according to an embodiment of the inventive concepts.

FIG. 13 is a cross-sectional view illustrating an area of a display panel according to an embodiment of the inventive concepts. In the present embodiment, the same or substantially the same/similar components as those in the embodiments of FIGS. 1 to 12 will be indicated by the same or substantially the same/similar reference designators, and thus, redundant descriptions of the same or substantially the same/similar components and features as described with reference to the embodiments of FIGS. 1 to 12 may not be repeated.

Referring to FIG. 13, a display panel DP-B according to the present embodiment may include the base substrate BS, the auxiliary layer BL, the pixel PX, the plurality of the insulating layers 10, 20, 30 and 40, the encapsulation layer ECL, and the sensing unit 220. A second display area RA2 of the display panel DP-B may include the light emitting zone PA and the transmission zone TZ.

In the present embodiment, the second electrode E2 may be disposed at (e.g., in or on) the light emitting zone PA, but may not be disposed at (e.g., in or on) the transmission zone TZ. A deposition preventing pattern PD-B may be disposed at (e.g., in or on) the transmission zone TZ. The deposition preventing pattern PD-B may be disposed at (e.g., in or on) the transmission zone TZ, but may not be disposed at (e.g., in or on) the light emitting zone PA.

In the present embodiment, the display panel DP-B may include a transmission opening T-OP. The transmission opening T-OP may include a first opening TO1 and a second opening TO2.

The first opening TO1 may penetrate (e.g., extend through) the third insulating layer 30 that overlaps with the transmission zone TZ, and the second opening TO2 may penetrate (e.g., extend through) the fourth insulating layer 40 that overlaps with the transmission zone TZ. The first opening TO1 may overlap with the second opening TO2.

In the present embodiment, the deposition preventing pattern PD-B may be disposed on the fourth insulating layer 40 that overlaps with the transmission zone TZ, and at (e.g., in or on) the transmission opening T-OP. For example, in the present embodiment, the deposition preventing pattern PD-B may be on a portion of the fourth insulating layer 40 that overlaps with the transmission zone TZ, and on (or within) the transmission opening T-OP in the transmission zone TZ. In FIG. 13, the control layer EL is disposed at (e.g., in or on) both the light emitting zone PA and the transmission zone TZ. However, embodiments of the inventive concepts are not limited thereto. In another embodiment, the control layer EL may be disposed at (e.g., in or on) only the light emitting zone PA. For example, the control layer EL may be disposed at (e.g., in or on) the light emitting zone PA, but not at (e.g., in or on) the transmission zone TZ. In this case, the deposition preventing pattern PD-B may cover the fourth insulating layer 40 and the transmission opening T-OP, which are disposed in the transmission zone TZ. In other words, when the control layer EL is not disposed at (e.g., in or on) the transmission zone TZ, the deposition preventing pattern PD-B may contact a portion of the fourth insulating layer 40 that is disposed at (e.g., in or on) the transmission zone TZ, and may contact an inner surface of the opening T-OP that overlaps with the transmission zone TZ. However, embodiments of the inventive concepts are not limited thereto.

In the display apparatus according to one or more embodiments of the inventive concepts, the second electrode may not be disposed at (e.g., in or on) the margin area, and thus, it may be possible to prevent or substantially prevent the performance of the electronic module from being deteriorated by reflection of light incident into or exiting from the periphery of the module hole.

According to one or more embodiments of the inventive concepts, the deposition preventing pattern may be disposed at (e.g., in or on) the margin area, and may be in contact (e.g., in direct contact) with the sealing member, and thus, the sealing member may be firmly adhered to the deposition preventing pattern.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts shall not be restricted or limited by the foregoing description, and are to be determined by the broadest reasonable interpretation of the following claims, and their equivalents.

What is claimed is:

1. A method of manufacturing a display apparatus comprising a base substrate having a front surface, a rear surface opposite the front surface, an active area, a peripheral area adjacent to the active area, and a hole area adjacent to the active area, the method comprising:
    forming a first electrode, an emission pattern on the first electrode, and a control layer on the emission pattern;
    forming a deposition-preventing layer on the control layer, the deposition-preventing layer overlapping with the hole area;
    forming a second electrode on the control layer, the second electrode overlapping with the active area and not overlapping with the deposition-preventing layer;
    forming an encapsulation layer on the second electrode; and
    forming a module hole that penetrates the base substrate, the module hole overlapping with the hole area,
    wherein the deposition-preventing layer and second electrode are in direct contact with the control layer, and the deposition-preventing layer and the second electrode are arranged spaced apart from each other on the control layer.

2. The method of claim 1, wherein the forming of the second electrode comprises depositing magnesium (Mg) or silver (Ag) on the control layer.

3. A method of manufacturing a display apparatus comprising a base substrate having a front surface, a rear surface opposite the front surface, an active area, a peripheral area adjacent to the active area, and a hole area adjacent to the active area, the method comprising:
    forming a first electrode, an emission pattern, and a control layer on the base substrate;
    forming a deposition-preventing layer on the control layer by depositing and patterning a deuterated anthracene derivative or vapor-deposited glasses, the deposition-preventing layer overlapping with the hole area;
    forming a second electrode on the control layer, the second electrode overlapping with the active area and not overlapping with the deposition-preventing layer;
    forming an encapsulation layer on the second electrode; and
    forming a module hole that penetrates the base substrate, the module hole overlapping with the hole area.

* * * * *